US010734238B2

(12) United States Patent
Zhou et al.

(10) Patent No.: US 10,734,238 B2
(45) Date of Patent: Aug. 4, 2020

(54) ATOMIC LAYER DEPOSITION AND ETCH IN A SINGLE PLASMA CHAMBER FOR CRITICAL DIMENSION CONTROL

(71) Applicant: Lam Research Corporation, Fremont, CA (US)

(72) Inventors: Xiang Zhou, Santa Clara, CA (US); Yoshie Kimura, Castro Valley, CA (US); Duming Zhang, Union City, CA (US); Chen Xu, Pasadena, CA (US); Ganesh Upadhyaya, Pleasanton, CA (US); Mitchell Brooks, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 56 days.

(21) Appl. No.: 15/820,108

(22) Filed: Nov. 21, 2017

(65) Prior Publication Data
US 2019/0157095 A1  May 23, 2019

(51) Int. Cl.
*H01L 21/3065* (2006.01)
*H01L 21/02* (2006.01)
*C23C 16/455* (2006.01)
*H01L 21/033* (2006.01)
*H01L 21/308* (2006.01)

(52) U.S. Cl.
CPC .. *H01L 21/30655* (2013.01); *C23C 16/45542* (2013.01); *H01L 21/0217* (2013.01); *H01L 21/0228* (2013.01); *H01L 21/02164* (2013.01); *H01L 21/02186* (2013.01); *H01L 21/02205* (2013.01); *H01L 21/02274* (2013.01); *H01L 21/0337* (2013.01); *H01L 21/3086* (2013.01)

(58) Field of Classification Search
CPC ......... H01L 21/30655; H01L 21/02205; H01L 21/0228; H01L 21/28194; H01L 21/3141
USPC ................ 438/710, 717, 718, 736
See application file for complete search history.

(56) References Cited

U.S. PATENT DOCUMENTS

| 8,334,083 | B2 | 12/2012 | Luong et al. |
| 9,171,716 | B2 | 10/2015 | Fukuda |
| 9,269,590 | B2 | 2/2016 | Luere et al. |
| 9,576,811 | B2 | 2/2017 | Kanarik et al. |

(Continued)

FOREIGN PATENT DOCUMENTS

WO  WO 2017/048275 A1  3/2017

OTHER PUBLICATIONS

U.S. Appl. No. 15/820,263, filed Nov. 21, 2017, Zhou et al.

(Continued)

*Primary Examiner* — Binh X Tran
(74) *Attorney, Agent, or Firm* — Weaver Austin Villeneuve & Sampson LLP

(57) ABSTRACT

Methods and apparatuses for critical dimension (CD) control of substrate features using integrated atomic layer deposition (ALD) and etch processes are described herein. Methods include etching to form a mask pattern of features on a substrate having a width that is less than a desired width of structures to be subsequently formed by the mask pattern of features, conformally depositing a passivation layer by ALD that increases the width of the mask pattern of features to the desired width, and etching a layer of the substrate to a desired depth to form the plurality of structures having the desired width.

18 Claims, 12 Drawing Sheets

(56) References Cited

U.S. PATENT DOCUMENTS

| | | | |
|---|---|---|---|
| 9,805,941 | B2 | 10/2017 | Kanarik et al. |
| 9,806,252 | B2 | 10/2017 | Tan et al. |
| 9,870,899 | B2 | 1/2018 | Yang et al. |
| 9,997,371 | B1 | 6/2018 | Agarwal |
| 9,997,631 | B2 | 6/2018 | Yang et al. |
| 10,074,543 | B2 | 9/2018 | Mahorowala et al. |
| 10,446,394 | B2 | 10/2019 | Abatchev et al. |
| 10,515,815 | B2 | 12/2019 | Zhou et al. |
| 2003/0192569 | A1 | 10/2003 | Goto et al. |
| 2004/0144489 | A1 | 7/2004 | Satoh et al. |
| 2005/0048785 | A1 | 3/2005 | Kang et al. |
| 2006/0226120 | A1 | 10/2006 | Rusu et al. |
| 2007/0196980 | A1 | 8/2007 | Subramanian |
| 2008/0230947 | A1 | 9/2008 | Chou et al. |
| 2009/0197420 | A1 | 8/2009 | Luong et al. |
| 2009/0206443 | A1 | 8/2009 | Juengling |
| 2009/0233446 | A1 | 9/2009 | Sakao et al. |
| 2009/0246965 | A1 | 10/2009 | Mori et al. |
| 2009/0275205 | A1 | 11/2009 | Kiehlbauch et al. |
| 2010/0173496 | A1 | 7/2010 | Zhong et al. |
| 2010/0323525 | A1 | 12/2010 | Chi et al. |
| 2012/0264305 | A1 | 10/2012 | Nakano |
| 2013/0189845 | A1 | 7/2013 | Kim et al. |
| 2013/0323923 | A1 | 12/2013 | Koehler et al. |
| 2014/0083978 | A1 | 3/2014 | Mahadeswaraswamy et al. |
| 2014/0213037 | A1 | 7/2014 | LiCausi et al. |
| 2014/0252478 | A1 | 9/2014 | Doornbos et al. |
| 2015/0102386 | A1 | 4/2015 | Chen et al. |
| 2015/0187602 | A1* | 7/2015 | Kim ................ H01L 21/0337 |
| | | | 428/195.1 |
| 2015/0249018 | A1 | 9/2015 | Park et al. |
| 2015/0322569 | A1 | 11/2015 | Kilpi et al. |
| 2015/0380272 | A1* | 12/2015 | Wu ................ H01L 21/32136 |
| | | | 438/653 |
| 2016/0056270 | A1 | 2/2016 | Dal |
| 2016/0064379 | A1 | 3/2016 | Yu |
| 2016/0111309 | A1 | 4/2016 | Lill et al. |
| 2016/0126243 | A1 | 5/2016 | Weis |
| 2016/0307769 | A1 | 10/2016 | Tseng et al. |
| 2016/0308112 | A1* | 10/2016 | Tan .................... H01L 41/47 |
| 2016/0314985 | A1 | 10/2016 | Yang et al. |
| 2016/0336178 | A1 | 11/2016 | Swaminathan et al. |
| 2016/0365425 | A1 | 12/2016 | Chen et al. |
| 2016/0379824 | A1 | 12/2016 | Wise et al. |
| 2017/0229314 | A1 | 8/2017 | Tan et al. |
| 2017/0323831 | A1* | 11/2017 | Jeong ................ H01L 21/3081 |
| 2018/0019387 | A1 | 1/2018 | Tan et al. |
| 2018/0033635 | A1 | 2/2018 | Kanarik et al. |
| 2018/0061650 | A1 | 3/2018 | Mahorowala et al. |
| 2018/0090491 | A1* | 3/2018 | Huang .............. H01L 21/76224 |
| 2018/0240667 | A1 | 8/2018 | Yu et al. |
| 2018/0308680 | A1 | 10/2018 | Reddy et al. |
| 2019/0067120 | A1* | 2/2019 | Ching .............. H01L 21/823481 |
| 2019/0109002 | A1* | 4/2019 | Mattinen ........... H01L 21/02568 |
| 2019/0148501 | A1* | 5/2019 | Chen .................... H01L 29/4991 |
| | | | 257/288 |
| 2019/0157066 | A1 | 5/2019 | Zhou et al. |
| 2019/0157096 | A1 | 5/2019 | Zhou et al. |
| 2019/0237330 | A1 | 8/2019 | Abatchev et al. |

OTHER PUBLICATIONS

U.S. Appl. No. 15/820,110, filed Nov. 21, 2017, Zhou et al.
U.S. Appl. No. 15/719,484, filed Sep. 28, 2017, Kanarik et al.
U.S. Appl. No. 15/719,497, filed Sep. 28, 2017, Tan et al.
U.S. Appl. No. 15/582,359, filed Apr. 28, 2017, Agarwal et al.
U.S. Appl. No. 15/581,951, filed Apr. 28, 2017, Reddy et al.
International Search Report and Written Opinion dated Mar. 6, 2019 in Application No. PCT/US2018/060732.
International Search Report and Written Opinion dated Mar. 6, 2019 in Application No. PCT/US2018/060739.
International Search Report and Written Opinion dated Mar. 5, 2019 in Application No. PCT/US2018/060743.
U.S. Appl. No. 15/881,506, filed Jan. 26, 2018, Abatchev.
U.S. Office Action dated Dec. 11, 2018 issued in U.S. Appl. No. 15/820,263.
U.S. Office Action dated Dec. 14, 2018 issued in U.S. Appl. No. 15/881,506.
U.S. Notice of Allowance dated Apr. 4, 2019 issued in U.S. Appl. No. 15/820,263.
U.S. Notice of Allowance dated Mar. 8, 2019 issued in U.S. Appl. No. 15/881,506.
U.S. Notice of Allowance dated Sep. 16, 2019 issued in U.S. Appl. No. 15/820,263.
U.S. Office Action dated Sep. 9, 2019 issued in U.S. Appl. No. 15/820,110.
U.S. Notice of Allowance dated Jul. 3, 2019 issued in U.S. Appl. No. 15/881,506.
International Search Report and Written Opinion dated May 14, 2019 in Application No. PCT/US2019/014580.
U.S. Notice of Allowance dated Jan. 16, 2020 issued in U.S. Appl. No. 15/820,110.

* cited by examiner

ATOMIC LAYER DEPOSITION AND ETCH IN A SINGLE PLASMA CHAMBER FOR CRITICAL DIMENSION CONTROL

TECHNICAL FIELD

This disclosure relates generally to integrated deposition and etch processes in fabrication of semiconductor devices and, more particularly, to integrated atomic layer deposition (ALD) and etch processes in critical dimension control in fabrication of integrated circuits.

BACKGROUND

As device and features size continue to shrink in the semiconductor industry, patterning features of small critical dimensions will continue to gain importance in fabrication of advanced integrated circuits (ICs). Current photolithography methods may be limited in its ability to pattern small critical dimension features.

SUMMARY

This disclosure pertains to a method of critical dimension (CD) control. The method includes etching, in a plasma chamber, a first layer of a substrate to form a mask pattern of features, the mask pattern of features having a width that is less than a desired width of a plurality of structures to be formed by the mask pattern of features. The method further includes depositing, in the plasma chamber, a first passivation layer on the mask pattern of features by atomic layer deposition (ALD), the first passivation layer being deposited with a thickness that increases the width of the mask pattern of features to the desired width. The method further includes etching, in the plasma chamber, a second layer of the substrate to form the plurality of structures having the desired width.

In some implementations, the mask pattern of features includes one or more isolated features in an isolated feature region and one or more dense features in a dense feature region having a greater feature density than the isolated feature region. A CD gain between the one or more isolated features in the isolated feature region and the one or more dense features in the dense feature region may be the same or substantially similar after depositing the first passivation layer. A depth change between the isolated feature region and the dense feature region may be the same or substantially similar after etching the second layer of the substrate. In some implementations, the method further includes repeating operations of depositing by ALD and etching the second layer in the plasma chamber, where a CD gain between isolated features in the isolated feature region and dense features in the dense feature region is the same or substantially similar after repeating operations of depositing by ALD and etching the second layer. In some implementations, the mask pattern of features include one or more first features having a first material and one or more second features having a second material different than the first material, where a CD gain between the one or more first features and the one or more second features is the same or substantially similar after depositing the first passivation layer. In some implementations, operations of depositing by ALD and etching the second layer in the plasma chamber are performed without introducing a vacuum break in between operations. In some implementations, a thickness of the first passivation layer is between about 0.5 nm and about 3 nm. In some implementations, the method further includes depositing, in the plasma chamber, a second passivation layer on the plurality of structures by ALD after etching the second layer of the substrate, the second passivation layer being deposited with a thickness corresponding to a desired CD gain. In some implementations, the first passivation layer includes silicon oxide ($SiO_x$). In some implementations, depositing the first passivation layer by ALD includes introducing a precursor into the plasma chamber to adsorb on the mask pattern of features, converting the precursor with plasma to form an adsorption-limited amount of the first passivation layer, and repeating operations of introducing the precursor and converting the precursor until the thickness of the first passivation layer is deposited on the mask pattern of features.

These and other aspects are described further below with reference to the drawings.

DETAILED DESCRIPTION

Introduction

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Integrated Etch/ALD Processing Apparatus

As feature sizes shrink, pitch becomes smaller, and complementary metal-oxide-semiconductor (CMOS) technology scales to smaller nodes, thin conformal deposition techniques will continue to gain importance. Atomic layer deposition (ALD) is a film forming technique which is well-suited to the deposition of thin conformal films due to the fact that ALD deposits a single thin layer of material, the thickness being limited by the amount of one or more precursor reactants which may adsorb onto a substrate surface (i.e., forming an adsorption-limited layer) prior to film-forming chemical reaction itself. Each layer formed by ALD is thin and conformal, with the resulting film substantially conforming to the shape of underlying device structures and features.

Conventionally, ALD and etch processes are performed on separate tools or platforms. For example, ALD chambers do not run etch processes, and etch chambers do not run ALD processes. Plasma etch chambers that run a deposition process use a plasma-induced deposition process to form films that are not conformal and that are aspect ratio dependent.

Figure 1:
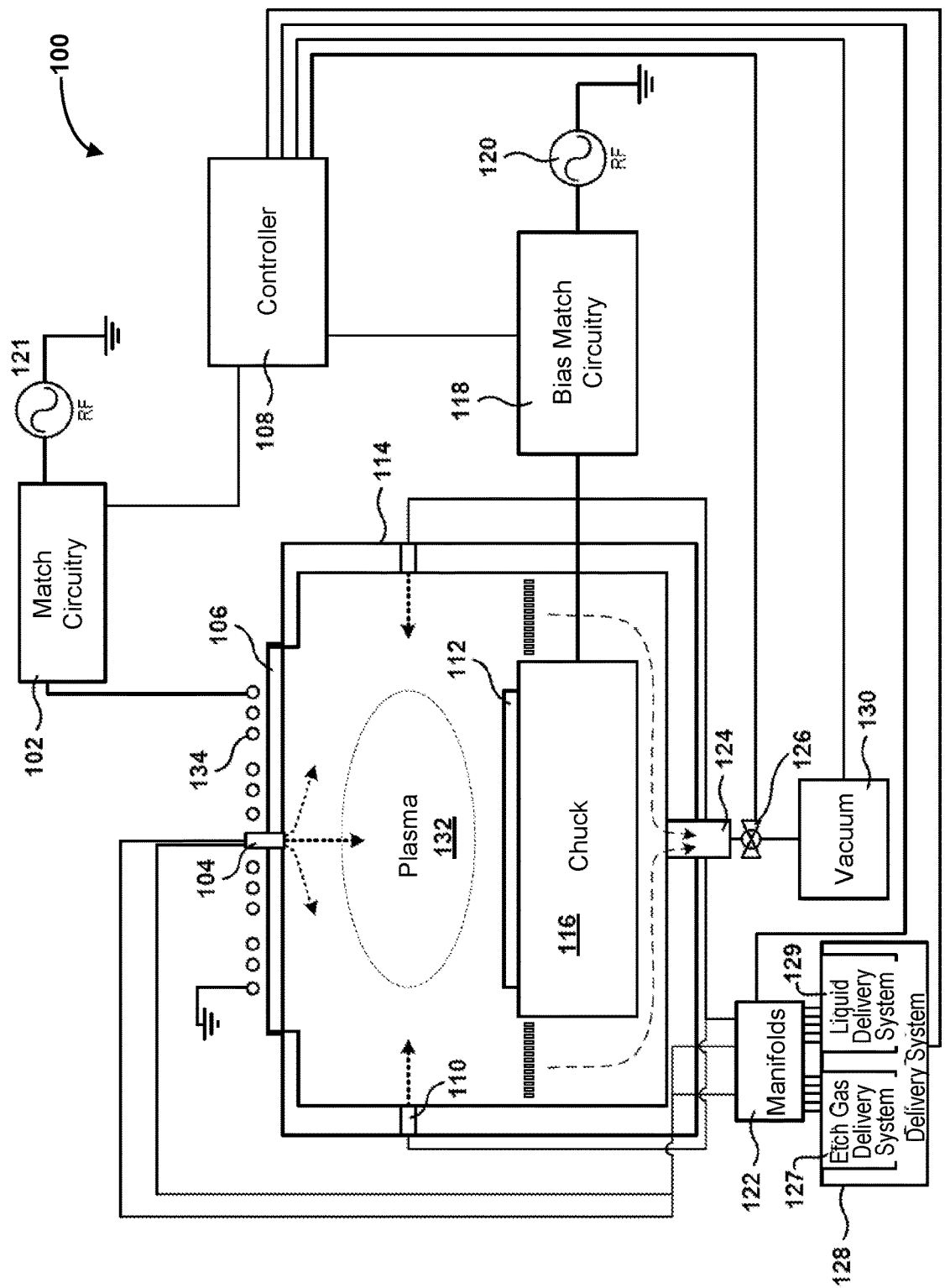
FIG. 1 is a schematic diagram of an example processing apparatus for performing etch and ALD operations according to some implementations.

FIG. 1 is a schematic diagram of an example processing apparatus for performing etch and ALD operations according to some implementations. The processing apparatus 100 may be an inductively coupled plasma processing apparatus. The processing apparatus 100 includes a plasma chamber 132 such as a plasma etch chamber. In some implementations, a Kiyo™ reactor, produced by Lam Research Corporation of Fremont, Calif., is an example of a suitable reactor that may be used as the plasma etch chamber.

Details regarding the processing apparatus 100 for performing etch and ALD operations are described in U.S. patent application Ser. No. 15/669,871, filed Aug. 4, 2017 to Zhou et al., and entitled "INTEGRATED ATOMIC LAYER PASSIVATION IN TCP ETCH CHAMBER AND IN-SITU ETCH-ALP METHOD," which is incorporated by reference in its entirety and for all purposes.

The plasma chamber 132 may include an overall chamber structure that may be defined by chamber walls 114 and a window 106. The window 106 may be fabricated from quartz or other dielectric material. In some implementations, the plasma chamber 132 includes a substrate support 116 disposed inside the plasma chamber 132. In some implementations, the substrate support 116 is an electrostatic chuck for supporting a substrate 112 upon which a deposition/etch process is performed. The electrostatic chuck may include electrostatic electrodes for chucking and dechucking the substrate 112. A filter and DC clamp power supply (not shown) may be provided for this purpose. Other control systems for lifting the substrate 112 off the substrate support 116 may also be provided. The substrate support 116 is configured to receive and hold the substrate 112.

In some implementations, the substrate support 116 may include a heater (not shown) to heat the substrate 112. The substrate support 116 may operate at elevated temperatures, such as between about −20° C. and about 150° C. The temperature will depend on the process operation and specific recipe. In some implementations, the plasma chamber 132 may also operate at certain pressures, such as pressures in between about 1 mTorr and about 1 Torr.

In some implementations, the processing apparatus 100 may include a radio-frequency (RF) power supply 120 that may be used for biasing/charging the substrate support 116. The RF power supply 120 may be defined by one or more RF generators. If multiple RF generators are provided, different frequencies may be used to achieve various tuning characteristics. A bias matching circuitry 118 is coupled between the RF power supply 120 and the substrate support 116. In this manner, the RF power supply 120 is connected to the substrate support 116.

A coil 134 is positioned over the window 106. The coil 134 may be fabricated from an electrically conductive material and includes at least one complete turn. The coil 134 shown in FIG. 1 includes at least three turns. An RF power supply 121 is configured to supply RF power to the coil 134. A matching circuitry 102 is coupled between the RF power supply 121 and the coil 134. In this manner, the RF power supply 121 is connected to the coil 134. In some implementations, an optional Faraday shield (not shown) is positioned between the coil 134 and the window 106. The Faraday shield may be maintained in a spaced apart relationship relative to the coil 134. The Faraday shield may be disposed immediately above the window 106. The Faraday shield may prevent metal or other species from depositing on the window 106 of the plasma chamber 132.

RF power is supplied from the RF power supply 121 to the coil 134 to cause an RF current to flow through the coil 134. The RF current flowing through the coil 134 may generate an electromagnetic field about the coil 134. The electromagnetic field generates an inductive current within the plasma chamber 132 that acts on the gas(es) present in the plasma chamber 132 to produce a plasma. Various ions and/or radicals from the plasma may interact with the substrate 112 to perform a deposition or etch operation.

In some implementations, the processing apparatus 100 optionally includes a plasma grid (not shown) that may be used to divide the plasma chamber 132 into an upper portion and a lower portion. The plasma grid may be used to limit the amount of hot electrodes into the lower portion of the plasma chamber 132. In some implementations, the processing apparatus 100 is designed to operate such that plasma present in the lower portion of the plasma chamber 132 is an ion-ion plasma and the plasma present in the upper portion of the plasma chamber 132 is an electron-ion plasma.

Process gases may be introduced into the plasma chamber 132 through a first gas injector 104 from the top of the plasma chamber 132 and/or through a second gas injector 110 from the side of the plasma chamber 132. Process gases may include vaporized liquid precursors or vaporized solid precursors, which may be vaporized in a solid source evaporator (not shown) upstream of the processing apparatus 100. One or more reactant gases may be supplied through the first gas injector 104 and/or second gas injector 110. In some implementations, the gas injectors 104, 110 may be replaced by showerheads. It will be understood that additional or other gas supplies may be provided for supplying different gases to the plasma chamber 132 for various types of operations.

The various ways of injecting gas(es) into the plasma chamber 132 show that process gases, vaporized liquid precursors, and/or vaporized solid precursors may be provided into the plasma chamber 132 from various locations. In some implementations, only the first gas injector 104 is used. In some other implementations, only the second gas injector 110 is used. In some other implementations, both the first gas injector 104 and the second gas injector 110 are used. In some implementations, manifolds 122 control which gases are supplied to each of the different gas lines. Manifolds 122 allow for any type of gas (reactant, carrier, precursor, etc.) to be provided from any of the different gas lines. In some implementations, carrier gases can include gases such as oxygen ($O_2$), nitrogen ($N_2$), and helium (He). The gases may be introduced into the plasma chamber 132 without mixing or may be mixed with other gases before introduction into the plasma chamber 132.

Manifolds 122 may be used for selecting, switching, and/or mixing outputs from respective delivery systems in a delivery system 128. The delivery system 128 may, in some implementations, include an etch gas delivery system 127 and a liquid delivery system 129. The etch gas delivery system 127 may be configured to output etchant gases. Examples of etchant gases include but are not limited to chlorine ($Cl_2$), hydrogen bromide (HBr), and sulfur hexafluoride ($SF_6$). The liquid delivery system 129 may be configured to provide liquid precursor that is vaporized and delivered in vapor form in an ALD process. The vaporized liquid precursor may be introduced into the plasma chamber 132 and may adsorb onto a surface of the substrate 112. The adsorbed precursor may be converted to form an adsorption-limited amount of film using a plasma. An example liquid precursor may have a chemical composition of the formula: $C_xH_yN_zO_aSi_b$.

A vacuum pump 130 is connected to the plasma chamber 132 and may be used to draw out process gases from the plasma chamber 132 and to maintain a certain pressure within the plasma chamber 132. A valve 126 may be disposed between an exhaust 124 and the vacuum pump 130 to control the amount of vacuum suction being applied to the plasma chamber 132. In some implementations, the vacuum pump 130 can be a one or two stage mechanical dry pump and/or turbomolecular pump. In some implementations, the vacuum pump 130 may be activated after each time an ALD process is completed to purge the plasma chamber 132.

The processing apparatus 100 may be coupled to facilities (not shown) when installed in a clean room or a fabrication facility. Facilities include plumbing that provide processing gases, vacuum, temperature control, and environmental particle control. These facilities may be coupled to the processing apparatus 100 when installed in the target fabrication facility. Additionally, the processing apparatus 100 may be coupled to a transfer chamber that allows robotics to transfer substrates into and out of the plasma chamber 132 using automation.

In some implementations, a system controller 108 (which may include one or more physical or logical controllers) controls some or all of the operations of the processing apparatus 100. The system controller 108 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 108 they may be provided over a network. In certain implementations, the system controller 108 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the substrate (which in various implementations may be zero), the frequency and power applied to coils or other plasma generation components, substrate position, substrate movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 108. The instructions for setting process conditions for a phase may be included in a corresponding recipe phase, for example. In some implementations, the recipe phases may be sequentially arranged, such that steps in a doping process are executed in a certain order for that process phase. For example, a recipe may be configured to perform etch operations and include one or more cycles of an ALD process performed in between each of the etch operations.

In some implementations, the system controller 108 is configured with instructions for performing one or more of the following operations: etching, in the plasma chamber 132, a first layer of a substrate 112 to form a mask pattern of features, the mask pattern of features having a width that is less than a desired width of a plurality of structures to be formed by the mask pattern of features; depositing, in the plasma chamber 132, a first passivation layer on the mask pattern of features by ALD, the first passivation layer being deposited with a thickness that increases the width of the mask pattern of features to the desired width; and etching, in the plasma chamber 132, a second layer of the substrate 112 to form the plurality of structures having the desired width. The etching and depositing operations are performed without introducing a vacuum break in the plasma chamber 132. In some implementations, the system controller 108 is further configured to perform the following operation: repeating operations of depositing by ALD and etching in the plasma chamber 132.

Other computer software and/or programs may be employed in some embodiments. Examples of programs or sections of programs for this purpose include substrate positioning program, a process gas composition control program, a pressure control program, a heater control program, and an RF power supply control program.

In some cases, the system controller 108 controls gas concentration, substrate movement, and/or the power supplied to the coil 134 and/or substrate support 116. The system controller 108 may control the gas concentration by, for example, opening and closing relevant valves to produce one or more inlet gas stream that provide the necessary reactant(s) at the proper concentration(s). The substrate movement may be controlled by, for example, directing a substrate positioning system to move as desired. The power supplied to the coil 134 and/or substrate support 116 may be controlled to provide particular RF power levels. If a grid is used, the RF powers may be adjusted by the system controller 108 to create an electron-ion plasma in an upper portion of the plasma chamber 132 and ion-ion plasma in a lower portion of the plasma chamber 132. Further, the system controller 108 may be configured to supply power to the substrate support 116 under conditions such that an electron-ion plasma does not form in the lower portion of the plasma chamber 132.

The system controller 108 may control these and other aspects based on sensor output (e.g., when power, potential, pressure, etc. reach a certain threshold), the timing of an operation (e.g., opening valves at certain times in a process), or based on received instructions from the user.

In some implementations, a system controller 108 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 108, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the system controller 108 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 108 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller 108, in some implementations, may be a part of or coupled to a computer that is integrated with, coupled to the system, otherwise networked to the system, or a combination thereof. For example, the system controller 108 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 108 receives instructions in the form of data, which specify parameters for each of the processing steps to be performed during one or more operations. It should be understood that the parameters may be specific to the type of process to be performed and the type of tool that the system controller 108 is configured to interface with or control. Thus as described above, the system controller 108 may be distributed, such as by comprising one or more discrete controllers that are networked together and working towards a common purpose, such as the processes and controls described herein. An example of a distributed system controller 108 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the system controller 108 might communicate with one or more of other tool circuits or modules, other tool components, cluster tools, other tool interfaces, adjacent tools, neighboring tools, tools located throughout a factory, a main computer, another system controller 108, or tools used in material transport that bring containers of substrates to and from tool locations and/or load ports in a semiconductor manufacturing factory.

Patterning and Critical Dimensions

With shrinking device features and smaller pitches in semiconductor devices, it has become more important to control and finely tune a critical dimension (CD) of substrate features. CD may also be referred to as "minimum feature size" or "target design rule." In some implementations, CD may refer to the size of the smallest geometrical feature (e.g., width of interconnect lines, contacts, trenches, etc.). In some implementations, CD may refer to the narrowest width that a patterning process can achieve.

Patterning methods are used in many semiconductor manufacturing processes to achieve desired critical dimensions. A mask, such as a photoresist pattern or hard mask, may have a CD that is the width of the smallest feature. In some implementations, features may be formed when an etching operation is performed through the mask.

In pursuing features with smaller CD, masks with smaller CDs are desired. Photoresist masks generally have optical properties dependent on wavelength, with longer wavelength photoresist masks exposed to longer wavelength light having larger theoretical CDs and shorter wavelength photoresist masks exposed to shorter wavelength light having smaller theoretical CDs. However, the use of shorter wavelength photoresist masks may present additional problems over longer wavelength photoresist masks. For example, shorter wavelength photoresist masks may not have a selectivity as high as longer wavelength photoresist masks and may more easily deform under plasma etch conditions.

Masks of the present disclosure may be formed or otherwise provided using various patterning schemes, such as single patterning or multiple patterning. In particular, multiple patterning has been used to extend lithographic technology beyond its optical limits. Double patterning and quad patterning are example technologies used to extend lithographic technology beyond its optical limits and double patterning is now widely used in the industry for pitches less than about 80 nm. Current double patterning technologies often use sidewall spacers with two masking steps to pattern trenches. Methods of double patterning, particularly line patterning, in both positive and negative double patterning processes have involved the use of spacers and masks. Spacers can be deposited by ALD or by plasma-enhanced atomic layer deposition (PEALD) on a patterned core and may be used to create a smaller pitch pattern.

Figure 2A:
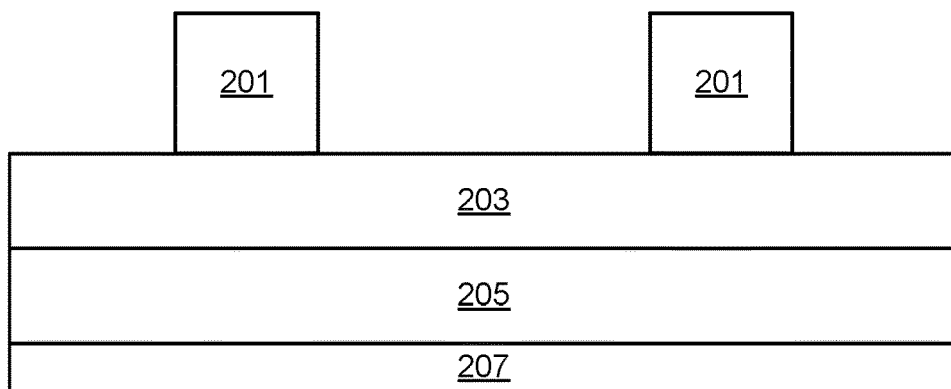
FIGS. 2A-2I are schematic illustrations of substrates in an example multiple patterning scheme according to some implementations.

FIGS. 2A-2I are schematic illustrations of substrates in an example multiple patterning scheme according to some implementations. FIG. 2A shows a substrate having a lithographically defined or patterned core 201 on a first layer 203, second layer 205 underlying the first layer 203, and third layer 207 underlying the second layer 205. One of ordinary skill in the art will appreciate that a multi-layer stack suitable for semiconductor processing as described herein may also include other layers, such as etch stop layers, cap layers, and other underlayers.

Figure 2B:
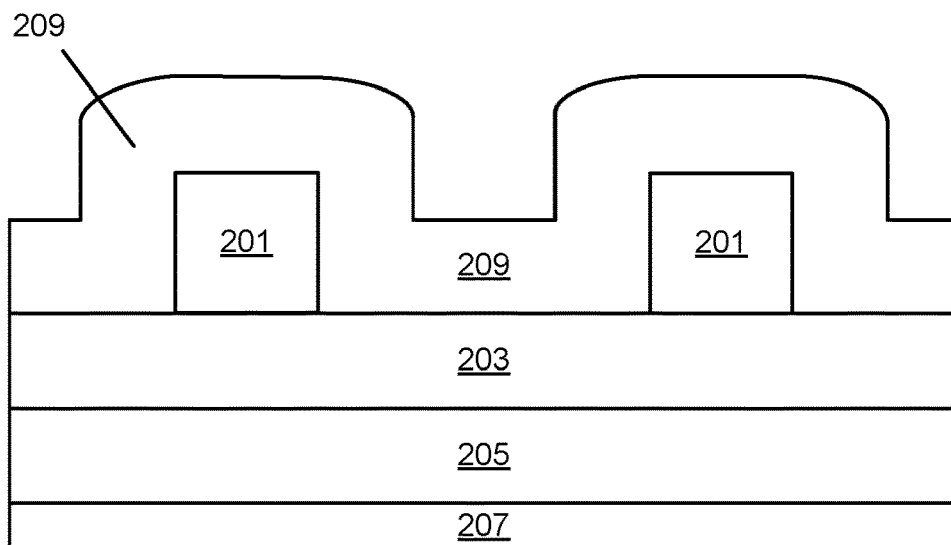
Figure 2C:
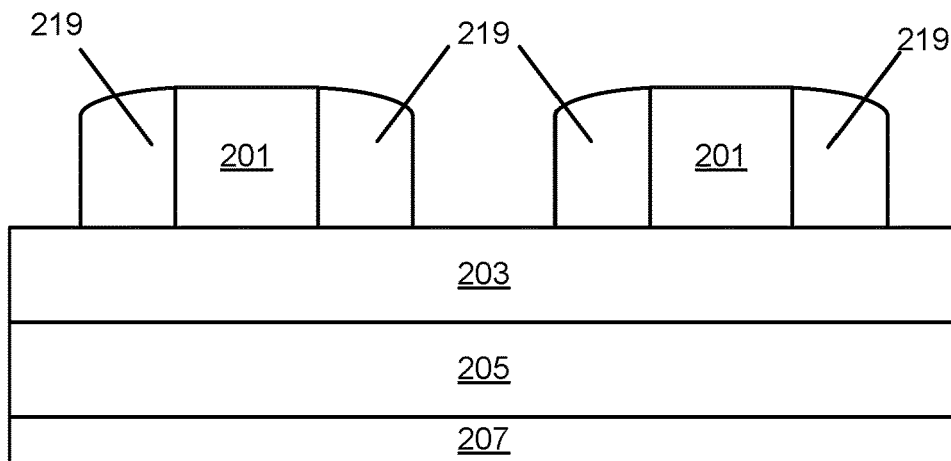
Figure 2D:
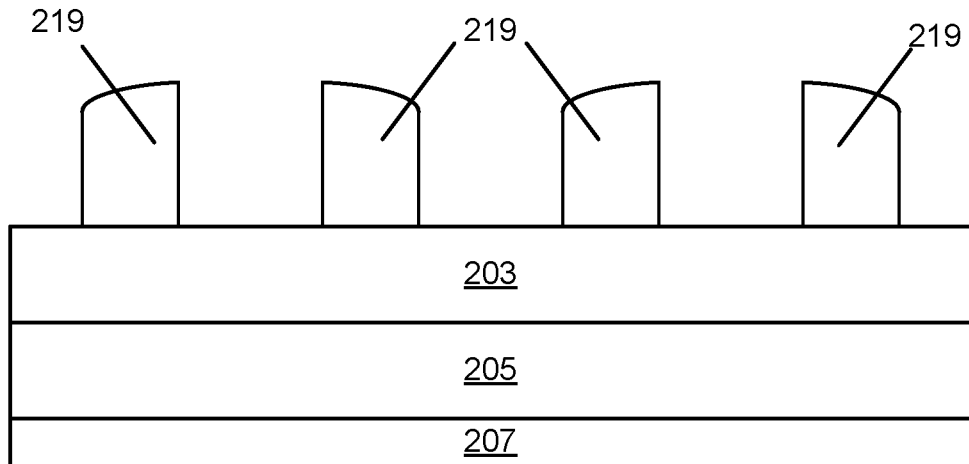
Figure 2E:
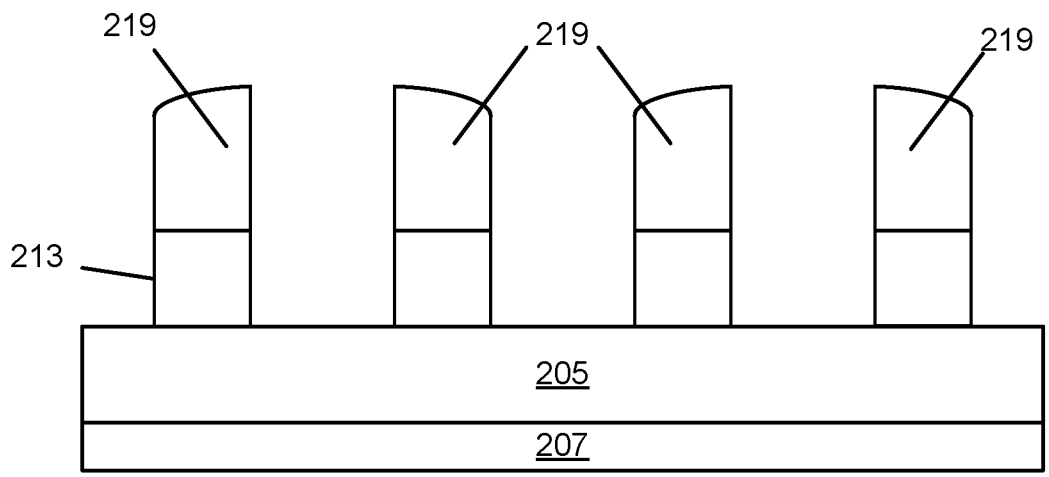
Figure 2F:
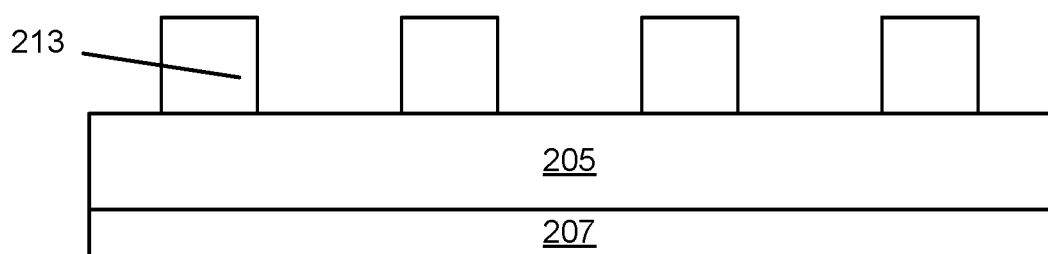
Figure 2G:
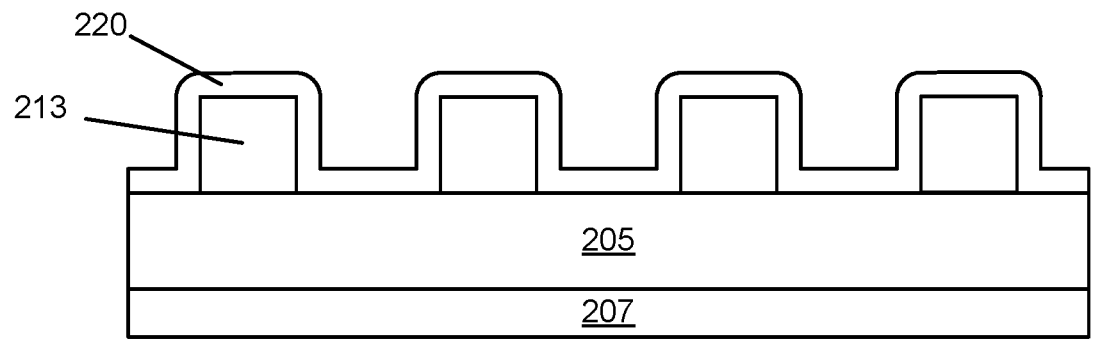
Figure 2H:
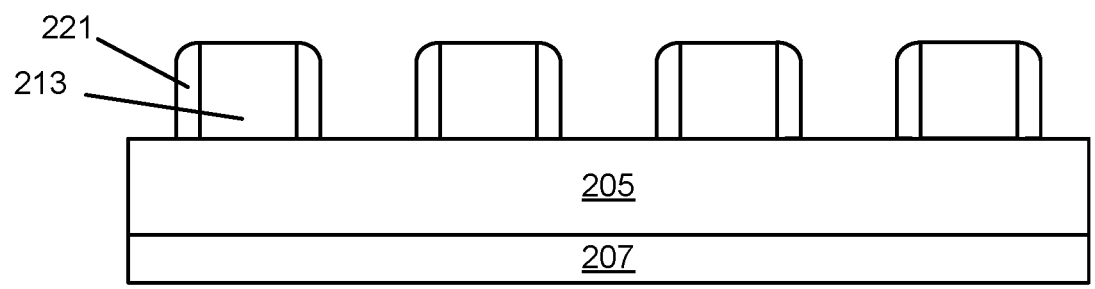
Figure 2I:
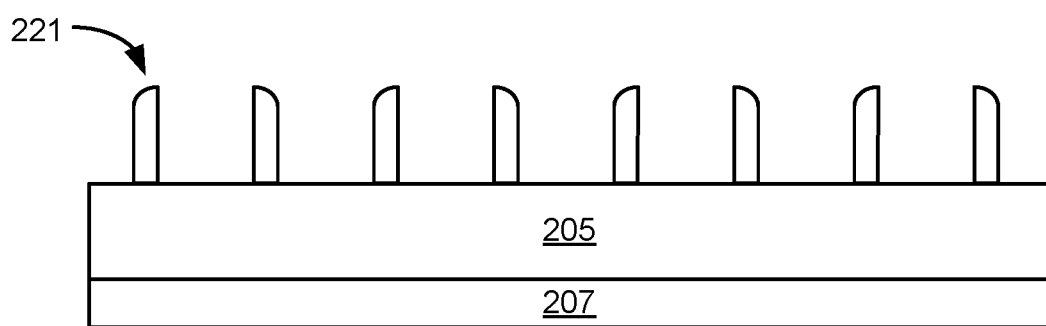

As shown in FIG. 2A, the patterned core 201 may be a photoresist or may include amorphous carbon or amorphous silicon material. The patterned core 201 may be deposited over the first layer 203 by any suitable deposition technique, and the deposition technique may involve generating a plasma in the deposition chamber from deposition gases such as a hydrocarbon precursor. The first layer 203, the second layer 205, or the third layer 207 may be the target layer ultimately to be patterned in the multiple patterning process. The target layer may be a semiconductor, dielectric, or other layer and may be made of silicon (Si), silicon oxide ($SiO_2$), silicon nitride (SiN), or titanium nitride (TiN), for example. In FIG. 2B, a conformal film 209 is deposited over the patterned core 201. The conformal film 209 may be deposited by ALD or PEALD in some implementations. The conformal film 209 may be directionally etched to form spacer 219 as shown in FIG. 2C. The spacer 219 may be an oxide, such as silicon oxide ($SiO_2$) or titanium oxide ($TiO_2$), or may be a nitride, such as silicon nitride (SiN). The pattern of the spacer 219 is used to pattern subsequent layers. It will be understood that the term "spacer" as used herein means a mask material adjacent to a core material. In FIG. 2D, the patterned core 201 is selectively etched, leaving free-standing spacers 219 on the substrate. Selective removal or selecting etching as used herein is defined as etching one material selective to another. For example, in FIG. 2D, the patterned core 201 is etched selective to the spacers 219. The pattern of the spacers 219 may have a desired pitch or CD, where the CD may be equal to or less than about 50 nm. In FIG. 2E, the first layer 203 is etched using the patterned spacers 219 as a mask, thereby transferring the pattern to the first layer 203 to form patterned first layer 213. The patterned first layer 213 may be etched using a chemistry suitable for etching the first layer 203 but not the patterned spacers 219. In some implementations, the patterned first layer 213 may be an amorphous carbon layer, amorphous silicon layer, or a photoresist, such as poly(methyl methacrylate) or poly(methyl glutarimide) (PMGI) or phenol formaldehyde resin. In FIG. 2F, the spacer 219 is selectively removed to leave patterned first layer 213. The patterned first layer 213 may provide a mask with a smaller CD for forming features with a smaller CD. However, the patterned first layer 213 may alternatively provide a second core material for subsequent patterning. In FIG. 2G, a second conformal film 220 may be deposited over the patterned first layer 213 (e.g., second core material). The second conformal film 220 may be a dielectric material deposited by ALD or PEALD. For example, the second conformal film 220 may be silicon oxide. In FIG. 2H, the second conformal film 220 is directionally etched to form second spacers 221 flanking the patterned first layer 213. In FIG. 2I, the patterned first layer 213 is selectively removed to leave second spacers 221. The second spacers 221 may provide a mask with an even smaller CD for forming features with an even smaller CD.

The pattern of the second spacers 221 may be transferred to the second layer 205. Multiple patterning techniques, such as a technique shown in FIGS. 2A-2I, may be used to achieve smaller CDs. However, multiple patterning techniques use etch steps and deposition steps that may require transferring between different tools and platforms as well as additional cleaning steps between etch and deposition steps as shown in FIG. 3A.

Figure 3A:
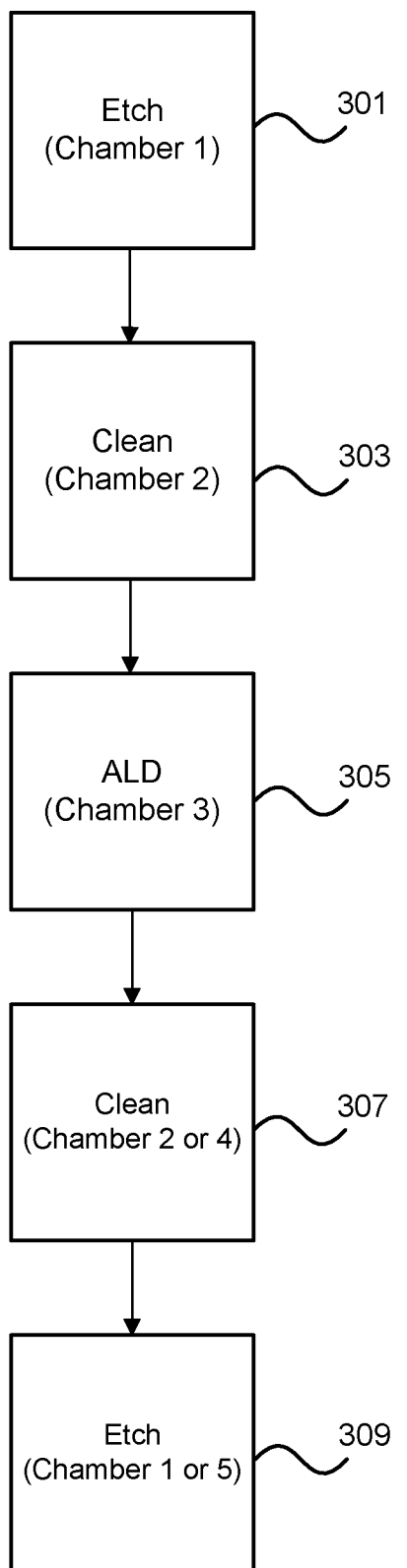
FIG. 3A shows an example process flow for substrate transport using conventional etch and ALD processes.

FIG. 3A shows an example process flow for substrate transport using conventional etch and ALD processes. It will be understood that such a process flow in FIG. 3A is not limited to multiple patterning schemes as discussed above, but may apply to other schemes using conventional etch and ALD processes. In FIG. 3A, a substrate is provided in an etch chamber and undergoes an etch step at block 301, transferred to a clean chamber to undergo a clean step at block 303, transferred to an ALD chamber to undergo an ALD step at block 305, transferred back to the same or different clean chamber to undergo a clean step at block 307, and transferred back to the same or different etch chamber at block 309. In performing an etch-dep-etch sequence, a substrate may undergo 4 substrate transfers through 3-5 different chambers. In some implementations, the etch step at block 301 may define a mask, the ALD step at block 305 may perform CD control, and the etch step at block 309 may define a final structure.

The use of separate chambers for deposition and etch increases processing time, processing steps, and costs, thereby having an adverse impact on throughput. Furthermore, the use of separate chambers requires transporting substrates from one chamber to another chamber, which entails vacuum breaks and increases the likelihood of unwanted materials or particles coming into contact with the substrates. This may result in the loss of material functionality and/or integrity on the substrate. Moreover, as shown in FIG. 3A, a clean process is generally required between etch and deposition processes, where the clean process can affect material properties and structure on the substrate. For example, a dilute hydrofluoric (HF) acid clean process has an impact on mask structures and can adversely impact performance.

To achieve smaller CDs while avoiding the problems associated with performing etch steps and deposition steps in different tools, a plasma etch chamber may be utilized and adapted to perform deposition. Such deposition processes may include chemical vapor deposition (CVD) and plasma enhanced chemical vapor deposition (PECVD) processes. However, such deposition processes typically deposit films that are not conformal. More specifically, the deposition processes are dependent on aspect ratio and deposit more material in more open spaces or wider pitches, resulting in non-uniform deposition across structures or features of different aspect ratios. Specifically, more deposition would take place in isolated features than in dense features, where a CD bias for isolated features is greater than a CD bias for dense features.

Implementations of the present disclosure relate to the integration of ALD steps and etch steps in a plasma chamber. By using in-situ ALD rather than ALD conducted in a separate chamber and rather than using CVD/PECVD in the same chamber, standalone ALD tools and additional cleaning tools are eliminated. Furthermore, processing time and costs are reduced by eliminating additional substrate transfers and clean time. In addition, using in-situ ALD avoids vacuum breaks between substrate transfers (e.g., between ex-situ deposition and clean), which may expose the substrate to unwanted materials, atmosphere, and/or moisture. Using in-situ ALD also reduces the impact of non-uniform deposition across structures or features of different aspect ratios. In-situ ALD may refer to the ALD performed in a plasma etch chamber, such as a plasma chamber in the processing apparatus 100 of FIG. 1 described above.

Figure 3B:
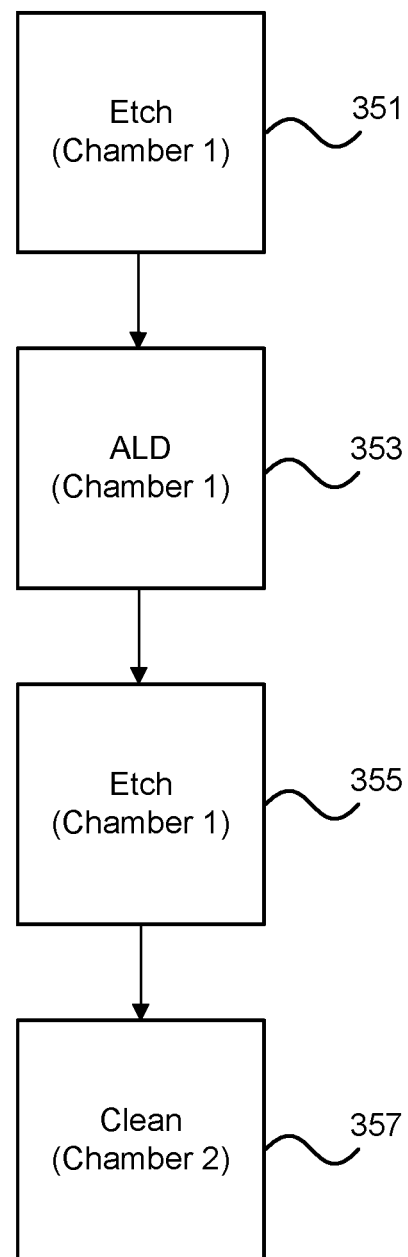
FIG. 3B shows an example process flow for substrate transport using integrated etch and ALD processes.

FIG. 3B shows an example process flow for substrate transport using integrated etch and ALD processes. It will be understood that such a process flow in FIG. 3B is not limited to multiple patterning schemes as discussed above, but may apply to other schemes for achieving smaller CDs and controlling CDs. In FIG. 3B, a substrate is provided in an etch chamber and undergoes an etch step at block 351, maintained in the same etch chamber to undergo an ALD step at block 353, maintained in the same etch chamber to undergo an etch step at block 355, and transferred to a clean chamber to undergo a clean step at block 357. In performing an etch-dep-etch sequence, a substrate may undergo 1 substrate transfer through 2 different chambers. In some implementations, the etch step at block 351 may define a mask, the ALD step at block 353 may perform CD control, and the etch step at block 355 may define a final structure.

Critical Dimension Control with In-Situ ALD and Etch

Implementations of the present disclosure relate to a method of CD control using in-situ ALD and etch. Specifically, cycles of ALD and etch steps are performed in the same process chamber or tool. In some implementations, the cycles of ALD and etch steps are performed in a plasma processing apparatus as described in FIG. 1. The cycles of ALD performed in the same plasma processing apparatus as etch provide conformal deposition that is used to control CD of one or more features of a substrate.

Figure 4:
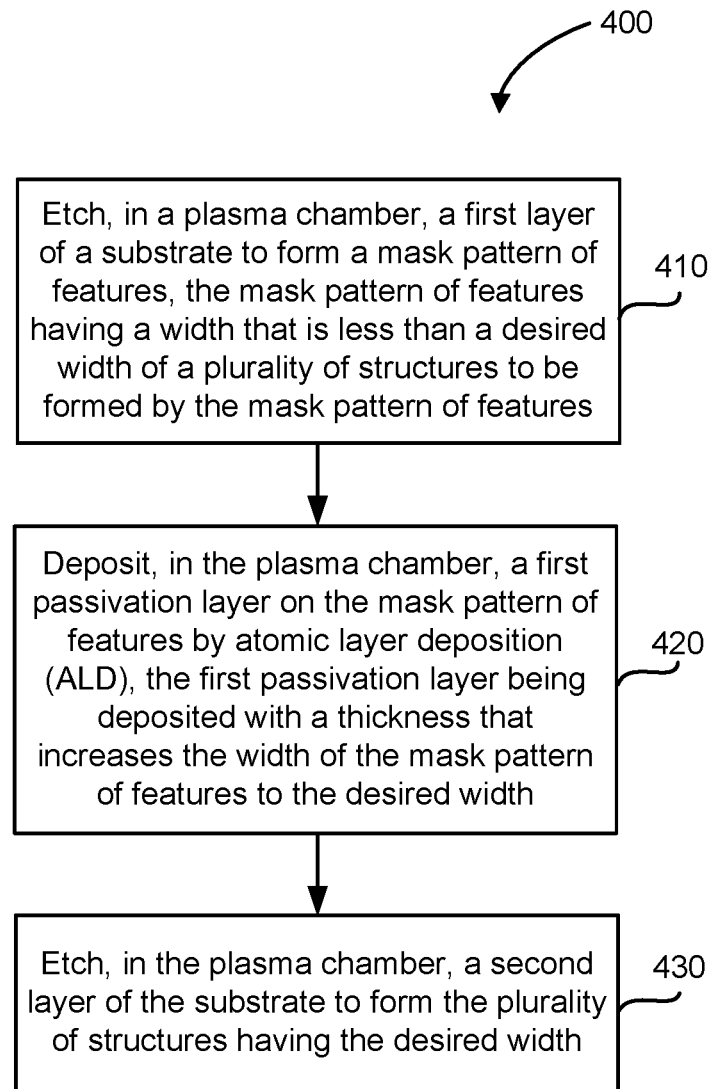
FIG. 4 is a flow diagram of an example method for critical dimension (CD) recovery using etch and ALD processes according to some implementations.

FIG. 4 is a flow diagram of an example method for critical dimension (CD) recovery using etch and ALD processes according to some implementations. The operations in a process 400 may be performed in different orders and/or with different, fewer, or additional operations.

At block 410 of the process 400, a first layer of a substrate is etched to form a mask pattern of features in a plasma chamber. The plasma chamber may be configured to perform subsequent etch and deposition processes. Aspects of the plasma chamber may be described with respect to the processing apparatus 100 in FIG. 1. The mask pattern of features has a width that is less than a desired width of a plurality of structures to be formed by the mask pattern of features. The mask pattern of features may be patterned by etching, and the mask pattern of features may serve as a mask during subsequent fabrication steps. In some implementations, the first layer for defining the mask pattern of features may include a resist or photoresist material. In some implementations, the first layer for defining the mask pattern of features may include a hard mask material. In some implementations, the first layer for defining the mask pattern of features may include silicon or other semiconducting material. Conventional etch and patterning processes may be used to form the mask pattern of features in the first layer.

In some implementations of the process 400, a substrate is provided in the plasma chamber. The substrate may be positioned on a substrate support in the plasma chamber. In some implementations, the substrate can be a semiconductor substrate, such as a 200-mm, 300-mm, or 450-mm substrate, including silicon substrates. In some implementations, the substrate is provided in the plasma chamber pre-patterned with the mask pattern of features.

In some implementations, the mask pattern of features may include one or more isolated features in an isolated feature region of the substrate and one or more dense features in a dense feature region of the substrate. The one or more dense features have greater feature density in the dense feature region than the one or more isolated features in the isolated feature region. The one or more dense features may provide features with higher aspect ratios than the one or more isolated features.

In some implementations, the mask pattern of features may include one or more features having a first material and one or more other features having a second material different than the first material. The mask pattern of features may include two different materials, where the two different materials may react differently in a passivation process or etch process. Two different materials may be used to create a mask or masks with different pitches. For example, the first material may include silicon and the second material may include silicon-germanium or germanium.

In some implementations, at least some of the mask pattern of features may have a tapered profile. Patterning processes may produce a mask profile having some degree of taper. In some implementations, the etch performed in block 410 may straighten the tapered profile and reduce any pinch-off or merging caused by subsequent deposition. In some implementations, the process 400 further includes anisotropically etching at least a portion of the mask pattern of features with the tapered profile to modify the tapered profile before subsequent deposition.

The mask pattern of features may include a plurality of geometric structures, spacers, or features, each having a width that corresponds to a critical dimension (CD) of the mask pattern of features. In some implementations, each of the geometric structures, spacers, or features of the mask pattern of features has a width that is the same or is substantially similar. With respect to the width or CD of the mask pattern of features, "substantially similar" throughout this disclosure refers to values within plus or minus 5% of a stated value. Thus, the CD or space CD of the mask pattern of features is relatively consistent or constant across the mask pattern of features as provided on the substrate. In some implementations, the CD or space CD between one or more isolated features and one or more dense features may be the same or substantially similar. In some implementations, a space CD of the mask pattern of features is equal to or less than about 5 nm.

After etching the first layer to form the mask pattern of features, the CD of the mask pattern of features will typically not be equal to the CD of a plurality of structures to be formed using the mask pattern of features. This may be attributable to effects of faceting, erosion of the mask, and undercutting due to lateral etching. In some cases, a higher degree of overetch is performed intentionally to increase a process window of a mask open etch process, at the expense of smaller CD. As a result, the CD of the plurality of structures to be formed using the mask pattern of features may be less than the CD of the mask pattern of features.

Passivation techniques may be applied on a mask to minimize CD loss due to etching. Plasma-based passivation in the form of, for example, "flash" passivation or etch byproduct re-deposition has been used to minimize effects of faceting, erosion of the mask, and undercutting due to lateral etching. Plasma-based passivation techniques, however, are generally aspect ratio dependent, meaning that more passivating material is loaded in isolated features than dense features. Plasma-based techniques are also material dependent, meaning that more or less passivating material is loaded between different materials. Furthermore, plasma-based passivation techniques, such as an oxygen "flash" passivation, consumes material on the target feature through oxidation and causes CD loss. "Flash" passivation can refer to striking a gas such as oxygen ($O_2$) and/or nitrogen ($N_2$) to form a plasma of dissociated radicals to react with a surface and form a passivating layer of material (e.g., oxide or nitride) on a surface. Passivation techniques in general may minimize effects of faceting, erosion of the mask, and undercutting due to lateral etching but does not control CD or finely tune CD. In other words, CD loss may be limited using conventional passivation techniques but the passivation technique itself is not applied to precisely tune CD.

At block 420 of the process 400, a first passivation layer is deposited on the mask pattern of features by atomic layer deposition (ALD) in the plasma chamber. The first passivation layer is deposited with a thickness that increases the width of the mask pattern of features to the desired width. ALD at block 420 is performed in the same plasma chamber as etch at block 410 without introducing a vacuum break in between operations.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. Unlike a CVD technique, ALD processes use surface-self-limited deposition reactions to deposit films on a layer-by-layer basis. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted reactant material or reaction byproducts from the chamber. The dose step may adsorb precursor material in a self-limiting manner such that once active sites are occupied by the precursor material, little or no additional precursor material will be adsorbed on the substrate surface. The reactant material may likewise react with the precursor material in a self-limiting or adsorption-limiting manner. Purge steps may be optionally performed to remove excess precursor material, reaction byproducts, and/or unreacted reactant material from the chamber, thereby completing an ALD cycle. ALD may be used to provide highly conformal films with high step coverage even in high aspect ratio features.

The first passivation layer may be conformally deposited by ALD on the mask pattern of features. The ALD process for conformally depositing the first passivation layer may occur in one or more cycles, where each cycle produces an adsorption-limited amount of passivation material on the mask pattern of features. Each cycle may include a dose step where a controlled amount of precursor material is delivered to a substrate surface to adsorb on the substrate surface in a self-limiting manner. This is also known as "soaking" the substrate surface to saturation. Each cycle may further include a conversion step following the dose step where reactant material is provided to react with the precursor material on the substrate surface and form an adsorption-limited amount of passivation material. The reactant material may include a reactant gas, where an RF power source generates plasma of the reactant gas in the plasma chamber. The reactant gas may include, for example, an oxygen-containing gas (e.g., $O_2$) or a nitrogen-containing gas (e.g., $N_2$ or $NH_3$). Radicals and other charged species of the reactant gas react with the precursor material to convert the precursor material to the adsorption-limited amount of passivation material. In some implementations, the reactant gas is exposed to RF power delivery in a relatively short amount of time, such as between about 0.5 seconds and about 5 seconds, to form the plasma to convert the precursor material. This is also known as a "flash" operation to convert the precursor material on the substrate surface using plasma from RF power delivered in a relatively short amount of time. In some implementations, a purge step may remove excess precursor material, reaction byproducts, and/or unreacted reactant material from the plasma chamber to complete the cycle. In some implementations, the dose step and the conversion step may be repeated until a desired thickness of the first passivation layer is deposited.

The first passivation layer may include, for example, an oxide (e.g., $SiO_x$) or a nitride (e.g., $Si_xN_y$). The first passivation layer serves to protect the mask pattern of features, including sidewalls of the mask pattern of features, during a subsequent etch process such as an etch process described at block 430.

The first passivation layer is conformally deposited by ALD and may have a high step coverage, such as a step coverage of greater than 85%, greater than 90%, or greater than 95%. The high conformality of the first passivation layer provides a relatively uniform thickness of the first passivation layer along a surface and sidewalls of the mask pattern of features. In some implementations, the thickness of the first passivation layer may be between about 0.1 nm and about 5 nm or between about 0.5 nm and about 3 nm. The thickness of the first passivation layer may increase the width of the mask pattern of features to the desired width in a linear relationship, where the desired width corresponds to the desired CD of the plurality of structures to be subsequently formed. Accordingly, the CD of the mask pattern of features may be controlled by the thickness of the first passivation layer. In some implementations, any CD loss from etching at block 410 may be recovered by a thickness of the deposited first passivation layer. In some implementations, CD may be precisely tuned at block 420 to control the CD of the mask pattern of features, thereby controlling a CD of the plurality of structures or features to be subsequently formed. The relevant CD for CD control or recovery may depend on an application of the semiconductor device being fabricated. After etching, the CD of the remaining material may be the relevant CD in some cases, such as a gate or transistor size following a patterning and gate etch. Or, the CD (e.g., space CD) of the removed material may be the relevant CD in some cases, such as when a space, trench, or hole is opened following an etch, which may or may not be subsequently filled. CD gain from the deposited first passivation layer may be independent of aspect ratio and independent of material. Furthermore, CD may be tuned at block 420 without affecting subsequent etch performance. In other words, CD may be tuned with minimal or negligible impact on CD loading between isolated and dense features, and with minimal or negligible impact on depth loading between isolated and dense features.

At block 430 of the process 400, a second layer of the substrate is etched in the plasma chamber to form the plurality of structures having the desired width. Etch at block 430 is performed in the same plasma chamber as etch at block 410 and ALD at block 420 without introducing a vacuum break in between operations.

The second layer may be a target layer for patterning various geometric features of the substrate, where such geometric features may correspond to or may be defined by the plurality of structures. The geometric features may include, for example, interconnect lines, contacts, trenches, recesses, spaces, holes, etc. The plurality of structures may be defined using the mask pattern of features, where a CD of the plurality of structures is the same or substantially similar to the CD of the mask pattern of features. With respect to the CD difference between the mask pattern of features and the plurality of structures, "substantially similar" throughout this disclosure refers to values within plus or minus 5% of a stated value. In some implementations, the CD of the plurality of structures may be equal to or less than about 20 nm, equal to or less than about 15 nm, or equal to or less than about 10 nm. Though the CD being described refers to a CD of the plurality of structures defined by the mask pattern of features, it will be understood that the relevant CD may be a space CD of a plurality of geometric features such as trenches, recesses, spaces, and holes defined by the mask pattern of features.

The etch performed in the plasma chamber may be an anisotropic etch through the second layer to form features in the second layer. The etch may be selective to etch material of the second layer over material of the first layer and the first passivation layer. That way the etch performed at block 430 selectively etches the second layer without etching the mask pattern of features. In some implementations, the etch may extend through the second layer to a first depth, where the first depth is less than a final depth. For example, the first depth may be any suitable percentage of the final depth, such as 20%, 30%, 40%, 50%, 60%, etc. of the final depth. Thus, multiple etches may be performed to reach the final depth.

In some implementations, operations of ALD and etching in the plasma chamber are repeated until the final depth is achieved. The final depth may extend partially through the second layer or entirely through the second layer. In some implementations, the final depth may extend through additional underlying layers, such as a third layer, fourth layer, etc. The repeated etch operation may etch through the second layer or a third layer underlying the second layer. In some implementations, the operations of ALD and etching in the plasma chamber are repeated in a multiple patterning process. For example, each ALD operation following an etch operation may conformally deposit additional passivation layers such as a second passivation layer, third passivation layer, etc. to further tune or reduce a CD of substrate features. And, each etch operation following an ALD operation may etch through the second layer or underlying layers such as a third layer, fourth layer, fifth layer, etc. In some implementations, the process 400 further includes depositing a second passivation layer on the plurality of structures by ALD after etching the second layer of the substrate, the second passivation layer being deposited with a thickness corresponding to a desired CD gain. The process 400 may further include etching the second layer or a third layer of the substrate to form a plurality of features (e.g., trenches) having a desired CD. This kind of multiple patterning scheme may enable shrinking critical dimensions in a controlled manner without substrate transfers between etch-dep-etch operations.

The first passivation layer protects the mask pattern of features from the etch at block 430. The sidewalls and surface of the mask pattern of features are protected with minimal CD loss independent of aspect ratio and independent of material. Moreover, the sidewalls and surface of the mask pattern of features are protected with minimal CD loading between different materials and aspect ratios, minimal profile loading between different materials and aspect ratios, and minimal depth loading between different materials and aspect ratios.

In some implementations, operations of depositing by ALD in the plasma chamber at block 420 and etching the second layer in the plasma chamber at block 430 are repeated in the process 400. Where the mask pattern of features includes isolated and dense features, a CD gain is the same or substantially similar after repeating operations of depositing by ALD and etching the second layer. Where the mask pattern of features includes different materials, a CD gain is the same or substantially similar after repeating operations of depositing by ALD and etching the second layer.

Figure 5A:
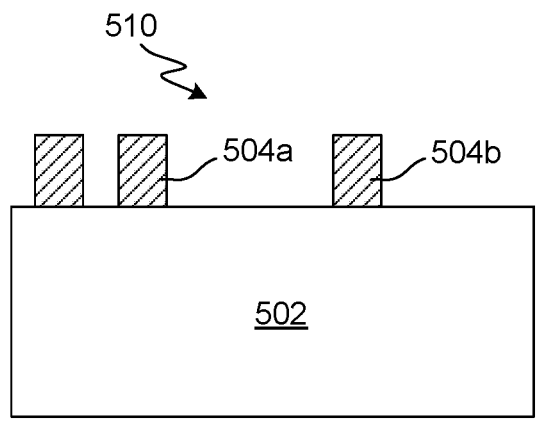
FIGS. 5A-5C are schematic illustrations of isolated and dense substrate features undergoing deposition and etch using a conventional deposition process in a plasma chamber.
Figure 5B:
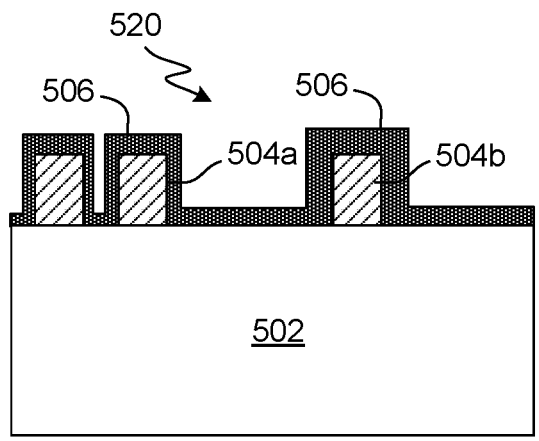
Figure 5C:
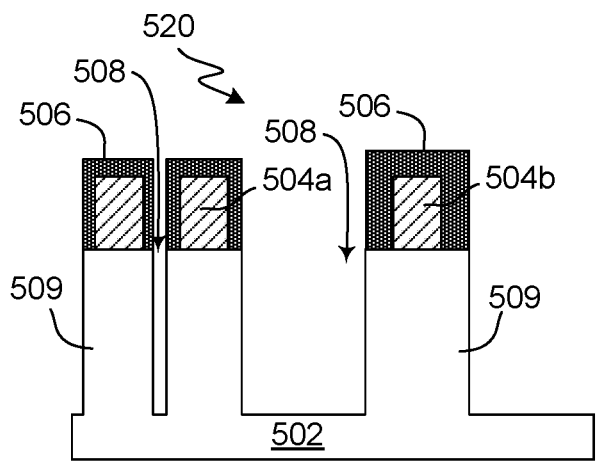
Figure 6A:
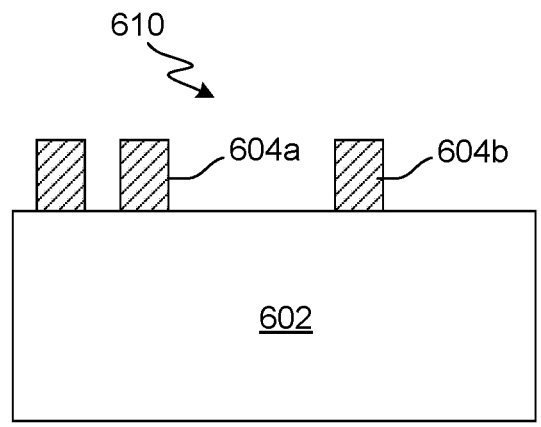
FIGS. 6A-6C are schematic illustrations of isolated and dense substrate features undergoing deposition and etch using integrated ALD and etch processes according to some implementations.
Figure 6B:
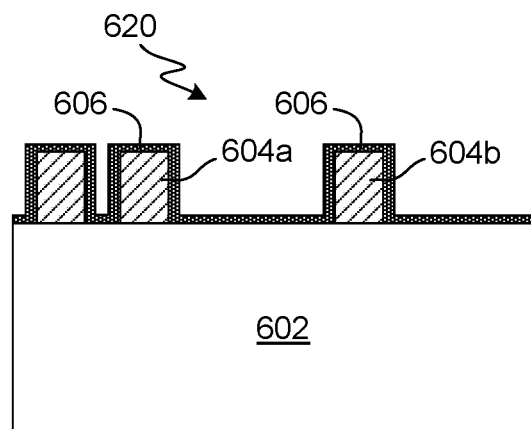
Figure 6C:
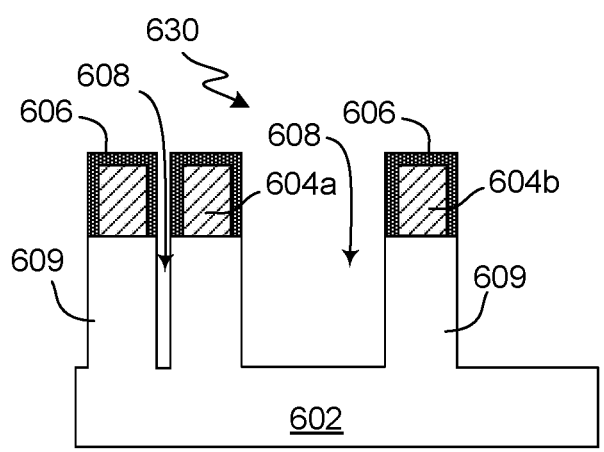

FIGS. 5A-5C are schematic illustrations of isolated and dense substrate features undergoing deposition and etch using a conventional deposition process in a plasma chamber. FIGS. 6A-6C are schematic illustrations of isolated and dense substrate features undergoing deposition and etch using integrated ALD and etch processes according to some implementations. A comparison between isolated and dense features in a conventional etch-dep-etch process versus an in-situ ALD etch-dep-etch process reveals the effects of CD bias and CD gain in isolated and dense features.

FIG. 5A shows a partially fabricated device structure 510 including a substrate 502 and a mask pattern of features 504a, 504b. The mask pattern of features 504a, 504b may be patterned and defined following an etch in a plasma chamber. The mask pattern of features 504a, 504b may be differentiated between dense features 504a in a dense feature region of the substrate 502 and isolated features 504b in an isolated feature region of the substrate 502, the dense features 504a having a greater feature density than the isolated features 504b. The dense features 504a in the dense feature region may define gaps having a higher aspect ratio than the isolated features 504b in the isolated feature region. The mask pattern of features 504a, 504b may have the same or substantially similar CD as shown in FIG. 5A.

FIG. 5B shows a partially fabricated device structure 520 including the substrate 502, the mask pattern of features 504a, 504b, and a first passivation layer 506 deposited on the mask pattern of features 504a, 504b. The first passivation layer 506 may be deposited using a conventional deposition process in the plasma chamber, such as CVD or PECVD. Alternatively, the first passivation layer 506 may be deposited using a plasma-based "flash" passivation technique, where part of the mask pattern of features 504a, 504b may be consumed through oxidation or nitridation. As shown in FIG. 5B, a thickness of the first passivation layer 506 is greater on the isolated features 504b in the isolated feature region than on the dense features 504a in the dense feature region. The isolated features 504b receive more deposition than the dense features 504a. Therefore, the CD gain is more in the isolated feature region than in the dense feature region. The partially fabricated device structure 520 represents the device structure 510 after deposition using a conventional deposition process in the plasma chamber.

FIG. 5C shows a partially fabricated device structure 530 including the substrate 502, the mask pattern of features 504a, 504b, the first passivation layer 506 deposited on the mask pattern of features 504a, 504b, and a plurality of features 508 within the substrate 502. The plurality of features 508 may be formed following an etch process in the plasma chamber. The etch process may anisotropically etch a layer of material in the substrate 502 to a desired depth. The plurality of features 508 may be defined by a plurality of structures 509 underlying the mask pattern of features 504a, 504b. An aspect ratio of the features 508 may be higher in the dense feature region than in the isolated feature region of the substrate 502. As shown in FIG. 5C, CD bias or CD loading in the isolated feature region is greater than the CD bias or CD loading in the dense feature region. Applying a conventional deposition process in the plasma chamber does not permit for precise CD control because a uniformity of deposition is dependent on aspect ratio. The partially fabricated device structure 530 represents the device structure 520 after etching in the plasma chamber.

FIG. 6A shows a partially fabricated device structure 610 including a substrate 602 and a mask pattern of features 604a, 604b. The mask pattern of features 604a, 604b may be patterned and defined following an etch in a plasma chamber. The mask pattern of features 604a, 604b may be differentiated between dense features 604a in a dense feature region of the substrate 602 and isolated features 604b in an isolated feature region of the substrate 602, the dense features 604a having a greater feature density than the isolated features 604b. The dense features 604a in the dense feature region may define gaps having a higher aspect ratio than the isolated features 604b in the isolated feature region. The mask pattern of features 604a, 604b may have the same or substantially similar CD as shown in FIG. 6A.

FIG. 6B shows a partially fabricated device structure 620 including the substrate 602, the mask pattern of features 604a, 604b, and a first passivation layer 606 conformally deposited on the mask pattern of features 604a, 604b. The first passivation layer 606 may be deposited using an in-situ ALD process as described above. As shown in FIG. 6B, a thickness of the first passivation layer 606 is relatively uniform on the isolated features 604b in the isolated feature region and on the dense features 604a in the dense feature region. The thickness of the first passivation layer 606 may be controlled to recover or tune a CD of the mask pattern of features 604a, 604b. That way, a CD of features to be formed by subsequent etching may be precisely tuned. As shown in FIG. 6B, the CD gain between the dense features 604a in the dense feature region and the isolated features 604b in the isolated feature region is the same or substantially similar. With respect to CD gain or CD bias between the dense features 604a and the isolated features 604b using in-situ ALD, "substantially similar" throughout this disclosure refers to values within 0.5 nm of a stated value. The partially fabricated device structure 620 represents the device structure 610 after deposition using an in-situ ALD process in the plasma chamber.

FIG. 6C shows a partially fabricated device structure 630 including the substrate 602, the mask pattern of features 604a, 604b, the first passivation layer 606 conformally deposited on the mask pattern of features 604a, 604b, and a plurality of features 608 within the substrate 602. The plurality of features 608 may be formed following an etch process in the plasma chamber. The etch process may anisotropically etch a layer of material in the substrate 602 to a desired depth. The plurality of features 608 may be defined by a plurality of structures 609 underlying the mask pattern of features 604a, 604b. An aspect ratio of the features 608 may be higher in the dense feature region than in the isolated feature region of the substrate 602. As shown in FIG. 6C, CD bias or CD loading between the dense feature region and the isolated feature region is the same or substantially similar. Applying in-situ ALD in the plasma chamber permits precise CD control because a uniformity of deposition is independent of aspect ratio. The partially fabricated device structure 630 represents the device structure 620 after etching in the plasma chamber.

Figure 7A:
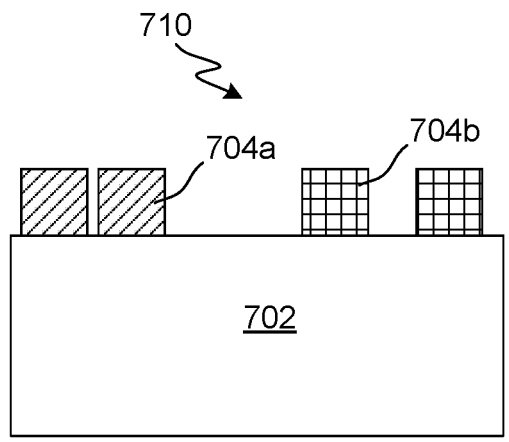
FIGS. 7A-7C are schematic illustrations of substrate features of different materials undergoing deposition and etch using a conventional deposition process in a plasma chamber.
Figure 7B:
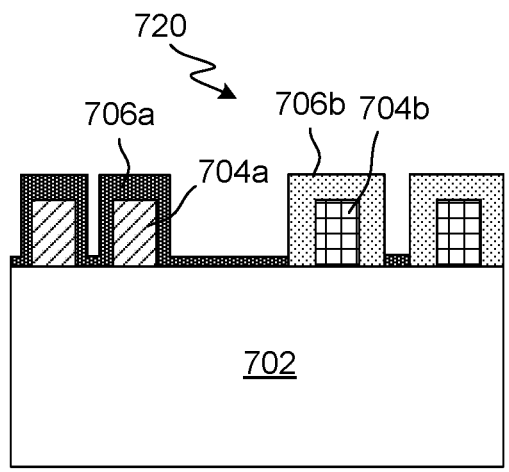
Figure 7C:
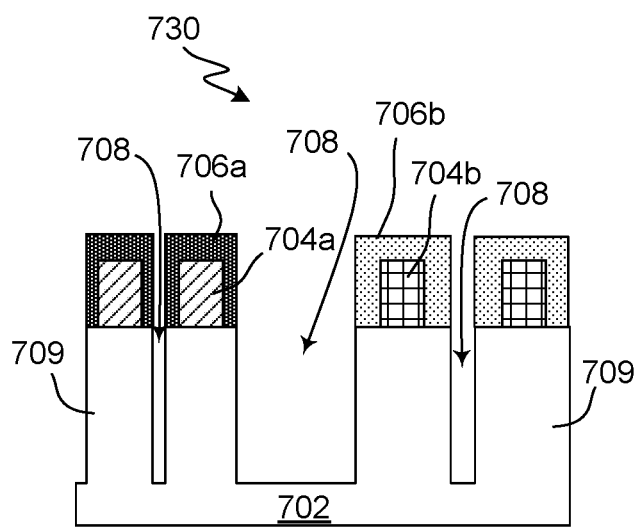
Figure 8A:
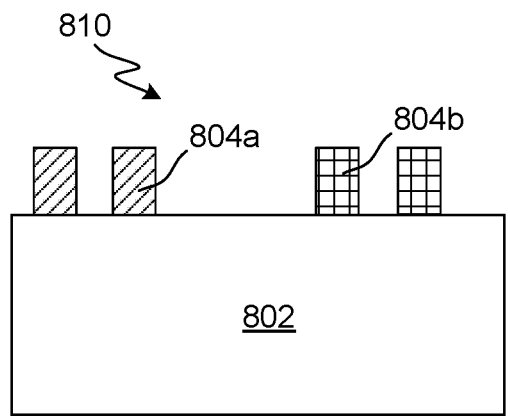
FIGS. 8A-8C are schematic illustrations of substrate features of different materials undergoing deposition and etch using integrated ALD and etch processes according to some implementations.
Figure 8B:
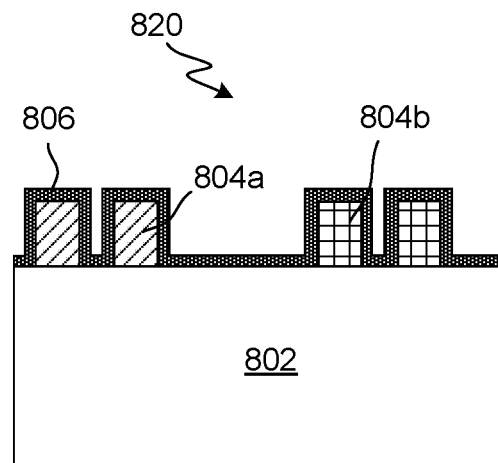
Figure 8C:
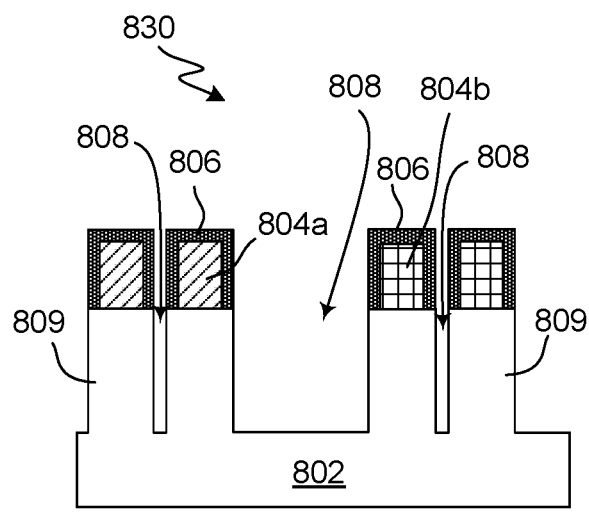

FIGS. 7A-7C are schematic illustrations of substrate features of different materials undergoing deposition and etch using a conventional deposition process in a plasma chamber. FIGS. 8A-8C are schematic illustrations of substrate features of different materials undergoing deposition and etch using integrated ALD and etch processes according to some implementations. A comparison between features made of different materials in a conventional etch-dep-etch process versus an in-situ ALD etch-dep-etch process reveals the effects of CD bias and CD gain in features made of different materials.

FIG. 7A shows a partially fabricated device structure 710 including a substrate 702 and a mask pattern of features 704a, 704b. The mask pattern of features 704a, 704b may be patterned and defined following an etch in a plasma chamber. The mask pattern of features 704a, 704b may include first features 704a having a first material and second features 704b having a second material, the second material being different than the first material. By way of an example, the first material can include silicon and the second material can include silicon-germanium or germanium. By way of another example, the first material can include an oxide and the second material can include carbon. In some implementations, a mask such as the mask pattern of features 704a, 704b may use different materials to create different pitches. Thus, the first features 704a may have a first pitch and the second features 704b may have a second pitch, where the second pitch is greater than the first pitch. The mask pattern of features 704a, 704b may have the same or substantially similar CD as shown in FIG. 7A.

FIG. 7B shows a partially fabricated device structure 720 including the substrate 702, the mask pattern of features 704a, 704b, and a first passivation layer 706a on the first features 704a and a second passivation layer 706b on the second features 704b. The first passivation layer 706a and the second passivation layer 706b may be formed using a conventional plasma-based "flash" passivation process in the plasma chamber. The conventional plasma-based "flash" passivation process exposes the surface of the substrate 702, the first features 704a, and the second features 704b to plasma of dissociated radicals of a gas such as $O_2$ or $N_2$ to convert the surface of the substrate 702, the first features 704a, and the second features 704b to a passivating material (e.g., oxide or nitride). Different materials may react differently to the conventional plasma-based "flash" passivation process, resulting in varying degrees of passivation between the different materials. As shown in FIG. 7B, a thickness of the second passivation layer 706b is greater than a thickness of the first passivation layer 706a. This can be a result of the second material converting to a thicker passivating material than the first material. In some implementations, more of the second material is consumed than the first material by a conventional plasma-based "flash" passivation process. Therefore, the CD gain is more in the second features 704b than in the first features 704a. The partially fabricated device structure 720 represents the device structure 710 after passivation in the plasma chamber.

FIG. 7C shows a partially fabricated device structure 730 including the substrate 702, the mask pattern of features 704a, 704b, the first passivation layer 706a on the first features 704a and the second passivation layer 706b on the second features 704b, and a plurality of features 708 within the substrate 702. The plurality of features 708 may be formed following an etch process in the plasma chamber. The etch process may anisotropically etch a layer of material in the substrate 702 to a desired depth. The plurality of features 508 may be defined by a plurality of structures 709 underlying the mask pattern of features 704a, 704b. The thickness of the first passivation layer 706a on the first features 704a is different than the thickness of the second passivation layer 706b on the second features 704b. Not only that, an etch resistance of the first passivation layer 706a on the first features 704a may be different than an etch resistance of the second passivation layer 706b on the second features 704b. As shown in FIG. 7C, CD bias or CD loading at the second features 704b is greater than the CD bias or CD loading at the first features 704a. Applying a conventional plasma-based "flash" passivation process in the plasma chamber does not permit for precise CD control because uniformity of passivation is dependent on material. The partially fabricated device structure 730 represents the device structure 720 after etching in the plasma chamber.

FIG. 8A shows a partially fabricated device structure 810 including a substrate 802 and a mask pattern of features 804a, 804b. The mask pattern of features 804a, 804b may be patterned and defined following an etch in a plasma chamber. The mask pattern of features 804a, 804b may include first features 804a having a first material and second features 804b having a second material, the second material being different than the first material. By way of an example, the first material can include silicon and the second material can include silicon-germanium or germanium. By way of another example, the first material can include an oxide and the second material can include carbon. In some implementations, a mask such as the mask pattern of features 804a, 804b may use different materials to create different pitches. Thus, the first features 804a may have a first pitch and the second features 804b may have a second pitch, where the second pitch is greater than the first pitch. The mask pattern of features 804a, 804b may have the same or substantially similar CD as shown in FIG. 8A.

FIG. 8B shows a partially fabricated device structure 820 including the substrate 802, the mask pattern of features 804a, 804b, and a first passivation layer 806 conformally deposited on the mask pattern of features 804a, 804b. The first passivation layer 806 may be deposited using an in-situ ALD process as described above. As shown in FIG. 8B, a thickness of the first passivation layer 806 is relatively uniform on the first features 804a and the second features 804b. The thickness of the first passivation layer 806 may be controlled to recover or tune a CD of the mask pattern of features 804a, 804b. That way, a CD of features to be formed by subsequent etching may be precisely tuned. As shown in FIG. 8B, a CD gain is the same or substantially similar between the first features 804a made of the first material and having the first pitch and the second features 804b made of the second material and having the second pitch. With respect to CD gain or CD bias between the first features 804a and the second features 804b using in-situ ALD, "substantially similar" throughout this disclosure refers to values within 0.5 nm of a stated value. The partially fabricated device structure 820 represents the device structure 810 after deposition using an in-situ ALD process in the plasma chamber.

FIG. 8C shows a partially fabricated device structure 830 including the substrate 802, the mask pattern of features 804a, 804b, the first passivation layer 806 conformally deposited on the mask pattern of features 804a, 804b, and a plurality of features 808 within the substrate 802. The plurality of features 808 may be formed following an etch process in the plasma chamber. The etch process may anisotropically etch a layer of material in the substrate 802 to a desired depth. The plurality of features 808 may be defined by a plurality of structures 809 underlying the mask pattern of features 804a, 804b. Rather than converting some of the first material in the first features 804a and some of the second material in the second features 804b in a conventional plasma-based "flash" passivation process via oxidation or nitridation, the in-situ ALD process reacts with the adsorbed precursor material in a self-limiting manner. A thickness of the first passivation layer 806 on the first features 804a and a thickness of the first passivation layer 806 on the second features 804b is the same or substantially similar. In addition, an etch resistance of the first passivation layer 806 on the first features 804a and on the second features 804b is the same because the in-situ ALD process is not converting different materials to form a passivating material. As shown in FIG. 8C, CD bias or CD loading at the first features 804a is the same or substantially similar to CD bias or CD loading at the second features 804b. Applying in-situ ALD in the plasma chamber permits precise CD control because uniformity of deposition is independent of material. The partially fabricated device structure 830 represents the device structure 820 after etching in the plasma chamber.

Figure 9A:
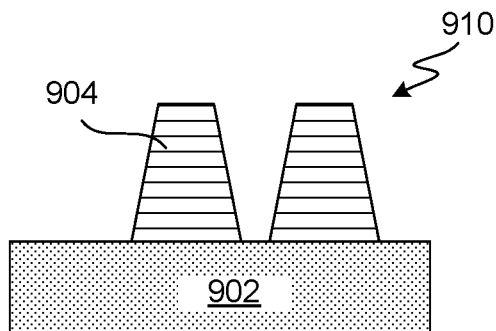
FIGS. 9A-9C are schematic illustrations of tapered substrate features undergoing deposition and etch in separate tools.
Figure 9B:
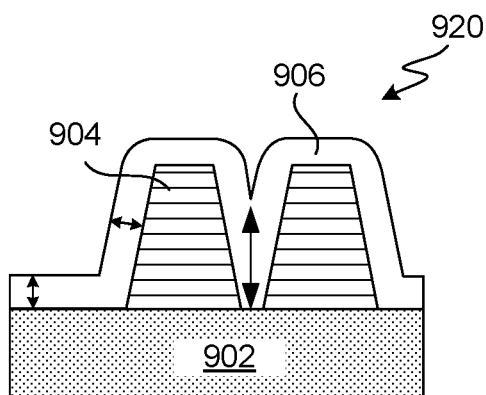
Figure 9C:
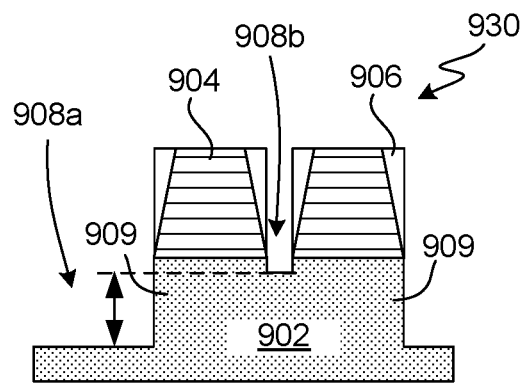

FIGS. 9A-9C are schematic illustrations of tapered substrate features undergoing deposition and etch in separate tools. FIGS. 10A-10D are schematic illustrations of tapered substrate features undergoing deposition and etch using integrated ALD and etch processes according to some implementations. Rather than depositing a layer via ALD in a separate chamber or tool in FIGS. 9A-9C, in-situ ALD as described above may cycle etch-dep processes to control CD with minimal depth loading between isolated and dense features.

FIG. 9A shows a partially fabricated device structure 910 including a substrate 902 and a mask pattern of features 904. Each of the features of the mask pattern of features 904 may have a tapered profile. In FIG. 9A, a space between the mask pattern of features 904 may define at least part of a dense feature region and a space to the left of the mask pattern of features 904 may define at least part of an isolated feature region. Thus, the mask pattern of features 904 may have a different pitch between features. In some implementations, the mask pattern of features 904 may be patterned and defined following an etch operation. In some implementations, the mask pattern of features 904 may include a hard mask. The mask pattern of features 904 may have the same or substantially similar CD as shown in FIG. 9A.

FIG. 9B shows a partially fabricated device structure 920 including the substrate 902, the mask pattern of features 904, and a layer 906 conformally deposited on the mask pattern of features 904. The deposited layer 906 may be conformally deposited using a suitable deposition technique such as ALD. In some implementations, the layer 906 may be a passivation layer. The passivation layer may include an oxide and/or nitride. Though the layer 906 is conformally deposited, a thickness of the layer 906 may not be uniform along sidewalls and surfaces of the mask pattern of features 904. A space between the features 904 or a space CD of the mask pattern of features 904 may be relatively small or narrow. Moreover, deposition of the layer 906 may result in a relatively thick layer, particularly if the deposition is performed in a separate chamber or tool from the etch process. Otherwise, the deposition of the layer 906 may undergo several transfer steps and clean steps before attaining a desired thickness. As shown in FIG. 9B, a thick deposited layer 906 combined with a narrow space CD in the mask pattern of features 904 that has a tapered profile results in merging of the layer 906. The merging of the layer 906 may occur in the dense feature region between features 904. Thicker conformal deposition and a narrow space between features 904 in the dense feature region leads to "pinch-off" in the dense feature region, where a thickness of the layer 906 is greater in the dense feature region than in the isolated feature region. For example, if a space CD of the mask pattern of features 904 is less than 5 nm and if a thickness of the layer 906 is greater than 3 nm and is conformally deposited on the mask pattern of features 904, then "pinch-off" or merging of the layer 906 occurs in the dense feature region as shown in FIG. 9B. Even with deposition using ALD, CD bias or CD loading in the dense feature region may still occur. The partially fabricated device structure 920 represents the device structure 910 after deposition using ALD in a deposition chamber or tool.

FIG. 9C shows the partially fabricated device structure 930 including the substrate 902, the mask pattern of features 904, the layer 906 at least partially on the mask pattern of features 904, and a first feature 908a extending to a first depth in the isolated feature region of the substrate 902 and a second feature 908b extending to a second depth in the dense feature region of the substrate 902. The features 908a, 908b may be formed following an etch process or "break-through" in an etch chamber or plasma chamber separate from the deposition chamber. The "break-through" is an anisotropic etch through at least part of the substrate 902 to form the features 908a, 908b. The features 908a, 908b may be defined by a plurality of structures 909 underlying the mask pattern of features 904. At least some of the layer 906 may be retained on sidewalls of the mask pattern of features 904 after etching. The anisotropic etch may remove portions of the layer 906 to the left of the features 904 at the surface of the substrate 902 in the isolated feature region and may remove portions of the substrate 902 in the isolated feature region to form the first feature 908a. The anisotropic etch may also remove portions of the layer 906 between features 904 at the surface of the substrate 902 in the dense feature region and may remove portions of the substrate 902 in the dense feature region to form the second feature 908b. The first feature 908a extends to a first depth in the isolated feature region and the second feature 908b extends to a second depth in the dense feature region, where the first depth is greater than the second depth. Since the "break-through" in the dense feature region etches through a thicker amount of the layer 906, the second depth is shallower than the first depth. Accordingly, depth loading occurs between the isolated feature region and the dense feature region. The partially fabricated device structure 930 represents the device structure 920 after etching in the plasma chamber or etch chamber.

Figure 10A:
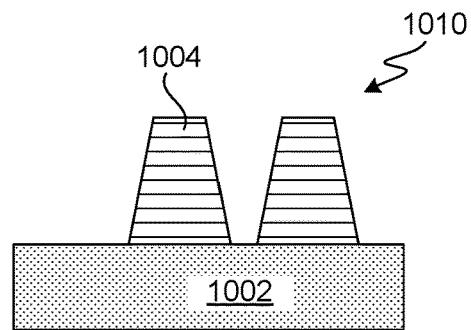
FIGS. 10A-10D are schematic illustrations of tapered substrate features undergoing deposition and etch using integrated ALD and etch processes according to some implementations.

FIG. 10A shows a partially fabricated device structure 1010 including a substrate 1002 and a mask pattern of features 1004. Each of the features of the mask pattern of features 1004 may have a tapered profile. In FIG. 10A, a space between the mask pattern of features 1004 may define at least part of a dense feature region and a space to the left of the mask pattern of features 1004 may define at least part of an isolated feature region. Thus, the mask pattern of features 1004 may have a different pitch between features. In some implementations, the mask pattern of features 1004 may be patterned and defined following an etch operation. In some implementations, the mask pattern of features 1004 may include a hard mask. The mask pattern of features 1004 may have the same or substantially similar CD as shown in FIG. 10A.

Figure 10B:
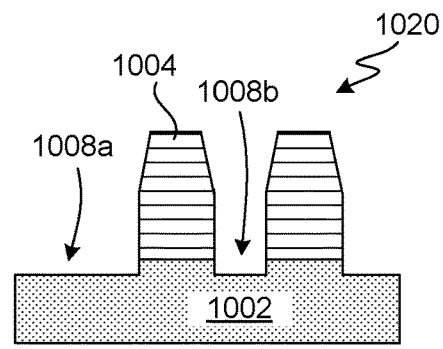

FIG. 10B shows a partially fabricated device structure 1020 including the substrate 1002 and mask pattern of features 1004, where the tapered profile of the mask pattern of features 1004 is partially corrected or straightened by etching. Prior to etching, in some implementations as shown in FIG. 10B, an etch operation may be performed prior to deposition. An anisotropic etch may remove edges of the mask pattern of features 1004 to straighten the mask profile and reduce the likelihood of any "pinch-off" or merging of subsequent deposition. The anisotropic etch may also remove at least a portion of the substrate 1002 in the isolated feature region and in the dense feature region. The etch operation forms a first shallow feature 1008a in the isolated feature region and a second shallow feature 1008b in the dense feature region, where a depth of each of the shallow features 1008a, 1008b is the same or substantially similar. With respect to the depth of the shallow features 1008a, 1008b, "substantially similar" throughout this disclosure refers to values within plus or minus 5% of a stated value. The etch operation may be performed in a plasma chamber also used in subsequent deposition operations. The partially fabricated device structure 1020 represents the device structure 1010 after etching to correct the mask pattern of features 1004 in the plasma chamber.

Figure 10C:
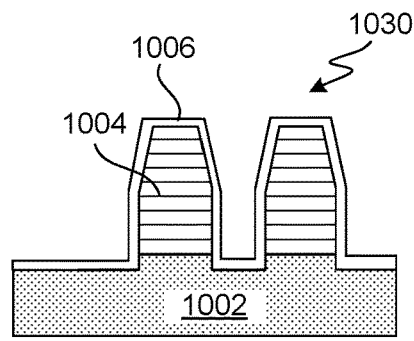

FIG. 10C shows a partially fabricated device structure 1030 including the substrate 1002, the mask pattern of features 1004 with a straightened profile, and a layer 1006 conformally deposited on the mask pattern of features 1004. The deposited layer 1006 may be conformally deposited using in-situ ALD as described above in the plasma chamber. In some implementations, the layer 1006 may be a passivation layer. The passivation layer may include an oxide and/or nitride. Deposition of the layer 1006 may result in a relatively thin layer, particularly since the deposition is performed in the same chamber as a subsequent etch process. For example, the layer 1006 may have a thickness equal to or less than about 3 nm, or between about 0.3 nm and about 2 nm. A desired thickness of the layer 1006 may be achieved by sequentially cycling between dep-etch operations in the plasma chamber without having to transfer between different chambers or tools. Furthermore, a space between the features 1004 or a space CD of the mask pattern of features 1004 may be widened by performing the anisotropic etch in FIG. 10B. As shown in FIG. 10C, a thickness of the layer 1006 is relatively uniform along sidewalls and surfaces of the mask pattern of features 1004. The layer 1006 avoids "pinch-off" and merging in the dense feature region due in part to the widened CD space, the straightened mask profile, and the thinly deposited layer 1006 on the mask pattern of features 1004 using in-situ ALD. ALD deposition and anisotropic etch steps can be repeated in cycles to reach a final CD target without pinching off or depth loading. CD bias or CD loading is the same or substantially similar in the dense feature region and the isolated feature region. With respect to the CD bias of the layer 1006 in the dense feature region and the isolated feature region, "substantially similar" throughout this disclosure refers to values within 0.3 nm of a stated value. A thickness of the conformally deposited layer 1006 may be used control CD of subsequent features to be formed in the substrate 1002. The partially fabricated device structure 1030 represents the device structure 1020 after deposition using ALD in the plasma chamber.

Figure 10D:
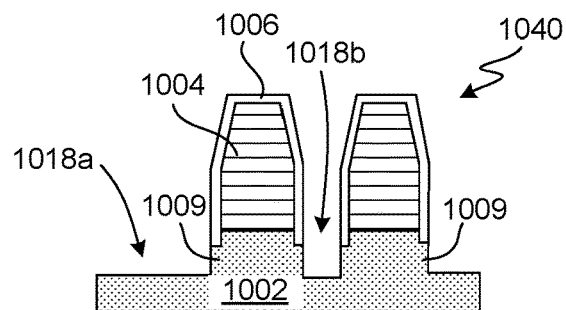

FIG. 10D shows a partially fabricated device structure 1040 including the substrate 1002, the mask pattern of feature 1004 with the straightened profile, the layer 1006 conformally deposited on the mask pattern of features 1004, and a first feature 1018a extending to a first depth in the isolated feature region of the substrate 1002 and a second feature 1018b extending to a second depth in the dense feature region of the substrate 1002. The features 1018a, 1018b may be formed following an etch process or "break-through" in the plasma chamber. The "break-through" is an anisotropic etch through at least part of the substrate 1002 to form the features 1018a, 1018b. The features 1018a, 1018b may be defined by a plurality of structures 1009 underlying the mask pattern of features 1004. At least some of the layer 1006 may be retained on sidewalls of the mask pattern of features 1004 after etching. The anisotropic etch may remove portions of the substrate 1002 in the dense feature region and the isolated feature region. The first feature 1018a extends to a first depth in the isolated feature region and the second feature 1018b extends to a second depth in the dense feature region, where a depth change between the first depth and the second depth is the same or substantially similar. With respect to the depth change or depth loading between features 1018a, 1018b in the dense feature region and the isolated feature region, "substantially similar" throughout this disclosure refers to values within plus or minus 5% of a stated value. After the anisotropic etch performed in FIG. 10D, additional cycles of ALD and etch operations may be repeated in the plasma chamber until a desired CD of the features 1018a, 1018b is achieved. This allows for fine tuning of the CD of the features 1018a, 1018b. The additional cycles of ALD and etch operations may be repeated with minimal depth loading between the isolated feature region and the dense feature region. The partially fabricated device structure 1040 represents the device structure 1030 after etching in the plasma chamber.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   etching, in a plasma chamber, a first layer of a substrate to form a mask pattern of features, the mask pattern of features having a width that is less than a desired width of a plurality of structures to be formed by the mask pattern of features, wherein the mask pattern of features includes one or more isolated features in an isolated feature region and one or more dense features in a dense feature region having a greater feature density than the isolated feature region;
   depositing, in the same plasma chamber as etching the first layer of the substrate, a first passivation layer on the mask pattern of features by atomic layer deposition (ALD), the first passivation layer being deposited with a thickness that increases the width of the mask pattern of features to the desired width;
   etching, in the same plasma chamber as etching the first layer of the substrate and depositing the first passivation layer, a second layer of the substrate to form the plurality of structures having the desired width; and
   repeating operations of depositing by ALD and etching the second layer in the plasma chamber, wherein a CD gain between isolated features in the isolated feature region and dense features in the dense feature region is the same or substantially similar after repeating operations of depositing by ALD and etching the second layer.

2. The method of claim 1, wherein a critical dimension (CD) gain between the one or more isolated features in the isolated feature region and the one or more dense features in the dense feature region is the same or substantially similar after depositing the first passivation layer.

3. The method of claim 1, wherein a depth change between the isolated feature region and the dense feature region is the same or substantially similar after etching the second layer of the substrate.

4. The method of claim 1, wherein a CD of the mask pattern of features between the one or more isolated features and the one or more dense features is the same or substantially similar prior to depositing the first passivation layer.

5. The method of claim 1, wherein the plurality of structures define at least a first feature having a first aspect ratio and a second feature having a second aspect ratio different than the first aspect ratio, wherein a CD gain between the first feature and the second feature is the same or substantially similar after etching the second layer of the substrate.

6. The method of claim 1, wherein operations of depositing by ALD and etching the second layer in the same plasma chamber are performed without introducing a vacuum break in between operations.

7. The method of claim 1, wherein the desired width corresponds with a desired critical dimension of the plurality of structures.

8. The method of claim 1, wherein a critical dimension of the plurality of structures is equal to or less than about 20 nm.

9. The method of claim 1, wherein a thickness of the first passivation layer is between about 0.5 nm and about 3 nm.

10. The method of claim 1, wherein one or more of features of the mask pattern of features has a tapered profile, and wherein the method further comprises anisotropica y etching at least a portion of the mask pattern of features to modify the tapered profile before depositing the first passivation layer by ALD.

11. The method of claim 1, wherein a space CD of the mask pattern of features is equal to or less than about 5 nm.

12. The method of claim 1, further comprising:
depositing, in the same plasma chamber as etching the first layer of the substrate and depositing the first passivation layer, a second passivation layer on the plurality of structures by ALD after etching the second layer of the substrate, the second passivation layer being deposited with a thickness corresponding to a desired CD gain.

13. The method of claim 1, wherein the first passivation layer includes silicon oxide, and wherein the mask pattern of features includes photoresist.

14. The method of claim 1, wherein etching the second layer of the substrate etches the second layer to a depth that is less than a final desired depth.

15. The method of claim 1, wherein depositing the first passivation layer by ALD includes:
introducing a precursor into the plasma chamber to adsorb on the mask pattern of features,
converting the precursor with plasma to form an adsorption-limited amount of the first passivation layer, and
repeating operations of introducing the precursor and converting the precursor until the thickness of the first passivation layer is deposited on the mask pattern of features.

16. The method of claim 1, wherein the mask pattern of features include one or more first features having a first material and one or more second features having a second material different than the first material, wherein a CD gain between the one or more first features and the one or more second features is the same or substantially similar after depositing the first passivation layer.

17. The method of claim 16, further comprising:
repeating operations of depositing by ALD and etching the second layer in the same plasma chamber, wherein a CD gain between the one or more first features and the one or more second features is the same or substantially similar after repeating operations of depositing by ALD and etching the second layer.

18. The method of claim 16, wherein the first material includes silicon and the second material includes silicon-germanium or germanium.

* * * * *